(12) United States Patent
Jantzi et al.

(10) Patent No.: US 7,034,610 B2
(45) Date of Patent: *Apr. 25, 2006

(54) APPARATUS, SYSTEM, AND METHOD FOR AMPLIFYING A SIGNAL, AND APPLICATIONS THEREOF

(75) Inventors: Stephen A. Jantzi, Laguna Beach, CA (US); Anilkumar V. Tammineedi, Aliso Viejo, CA (US); Jungwoo Song, Irvine, CA (US); Lawrence M. Burns, Laguna Hills, CA (US); Donald G. McMullin, Laguna Hills, CA (US); Agnes N. Woo, Encino, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/861,379

(22) Filed: Jun. 7, 2004

(65) Prior Publication Data

US 2004/0232980 A1 Nov. 25, 2004

Related U.S. Application Data

(63) Continuation of application No. 10/163,143, filed on Jun. 7, 2002, now Pat. No. 6,747,510.

(60) Provisional application No. 60/296,481, filed on Jun. 8, 2001.

(51) Int. Cl.
H03F 1/14 (2006.01)
(52) U.S. Cl. ............... 330/51; 330/285; 330/298; 330/129; 330/288
(58) Field of Classification Search ............ 330/51, 330/129, 207 P, 285, 288, 298; 257/368
See application file for complete search history.

(56) References Cited

U.S. PATENT DOCUMENTS 4,455,663 A 6/1984 Ragsdale (Continued)

OTHER PUBLICATIONS

Chi-Hung Lin and Klaas Bult, *A 10-b, 55-Msample/s CMOS DAC in 0.06 $mm^2$*, IEEE Journal of Solid-State Circuits, IEEE vol. 33, pp. 1948-1958, (Dec. 1998).

(Continued)

*Primary Examiner*—Michael B. Shingleton
(74) *Attorney, Agent, or Firm*—Sterne, Kessler, Goldstein & Fox PLLC

(57) ABSTRACT

An upstream amplifier is integrated on a substrate with a digital-to-analog converter (DAC) to form an integrated circuit. In an embodiment, a low-pass filter is also integrated on the substrate. The output signal level of the upstream amplifier is controllable. In embodiments, fine adjustments are made to the output signal level of the upstream amplifier by varying a bias current of the DAC. A software control bit is used to switch between a power-on mode of operation and a power-down mode of operation. The upstream amplifier transmits in a burst mode. The power consumption of the upstream amplifier scales with the amplifier's output signal level. A high degree of matching is attained between the positive and negative paths of the upstream amplifier. This provides high immunity from common-mode disturbances such as substrate noise, clock spurs, and glitches caused by a gain change.

17 Claims, 20 Drawing Sheets

U.S. PATENT DOCUMENTS

| | | |
|---|---|---|
| 5,363,061 A | 11/1994 | Barrett, Jr. et al. |
| 5,780,897 A * | 7/1998 | Krakauer .................. 257/368 |
| 5,903,191 A | 5/1999 | Gosser |
| 6,091,932 A | 7/2000 | Langlais |
| 6,175,278 B1 * | 1/2001 | Hasegawa .................. 330/278 |
| 6,226,322 B1 | 5/2001 | Mukherjee |
| 6,236,678 B1 | 5/2001 | Horton, Jr. et al. |
| 2002/0188957 A1 | 12/2002 | Jantzi et al. |

OTHER PUBLICATIONS

Chi-Hung Lin, *A 10b 500MSample/s CMOS DAC in 0.6 $mm^3$*, University of California Los Angeles dissertation, UCLA (167 pages) (1998).

Kimmo Koli, *CMOS Current Amplifiers: Speed versus Nonlinearity*, Helsinki University of Technology Electronic Circuit Design Laboratory, Report 30, Helsinki University of Technology, (305 pages) (Nov. 2000).

* cited by examiner

APPARATUS, SYSTEM, AND METHOD FOR AMPLIFYING A SIGNAL, AND APPLICATIONS THEREOF

CROSS REFERENCE TO RELATED APPLICATIONS

This application is a continuation of U.S. patent application Ser. No. 10/163,143, filed Jun. 7, 2002 (now U.S. Pat. No. 6,747,510), incorporated herein by reference in its entirety, which claims the benefit of U.S. Provisional Application No. 60/296,481, filed Jun. 8, 2001.

FIELD OF THE INVENTION

The present invention relates to amplifiers. The present invention also relates to cable-modems and cable set-top boxes.

BACKGROUND OF THE INVENTION

Various cable-modem systems and cable set-top box systems exist. These systems have an upstream information path and a down stream information path. The upstream path includes a digital-to-analog converter (DAC) and a cable line-driver/amplifier. The down stream path includes an analog-to-digital converter (ADC).

In conventional cable-modem systems and cable set-top box systems, the DAC and the ADC typically form part of a single integrated circuit or chip. This integration reduces the bill of materials and costs for these systems.

The cable line-driver/amplifier, however, is not integrated along with the DAC and the ADC.

While conventional cable-modem systems and cable set-top box systems, which have a stand-alone cable line-driver/amplifier chip work well for their intended purposes, there is a need for a new amplifier that can be integrated on a single chip with the DAC and the ADC. There is also a need for new cable-modem systems and cable set-top box systems having a higher level of integration than the conventional cable-modem systems and cable set-top box systems.

BRIEF SUMMARY OF THE INVENTION

An upstream amplifier is integrated on a substrate with a digital-to-analog converter (DAC) to form an integrated circuit. In embodiments, the integrated circuit is used, for example, to form part of an upstream path of a cable-modem system or a cable set-top box system. In one embodiment, a filter and an upstream amplifier are integrated on a substrate with a DAC. Other embodiments of the invention include additional integration. For example, in some embodiments, an analog-to-digital converter and a processor are integrated on the substrate. Embodiments of the invention also include off-chip components such as, for example, a transformer and a diplexer.

System embodiments of the invention typically include a DAC, a low-pass filter, an integrated upstream amplifier, a transformer, a diplexer, an analog-to-digital converter (ADC), a tuner, and a processor.

In an embodiment, the DAC generates a differential analog current signal proportional to a digital input value. The maximum output current level of the DAC is adjustable. This output current drives a variable-gain current-mode upstream amplifier. The upstream amplifier produces a differential output current signal that is converted to a voltage signal by one or more resistors. This voltage signal is coupled to the input terminals of a transformer. The transformer's single-ended output is coupled, for example using a diplexer, to a coaxial cable or other communications medium. The current-mode design of the upstream amplifier reduces or eliminates signal loss between the DAC and the upstream amplifier. With a current-mode design, the output voltage swing at the transformer is determined by the DAC's full-scale output current, the upstream amplifier's gain, and the upstream amplifier's load impedance. The upstream amplifier has a low input-impedance and low-impedance internal nodes. The low-impedance internal nodes make for low internal voltage swings and higher amplifier bandwidths. In other embodiments, other upstream amplifiers are used such as, for example, a voltage-mode amplifier.

In one embodiment, the output signal level of the upstream amplifier is varied, in part, by changing a bias current of the digital-to-analog converter. In another embodiment, the output signal level of the upstream amplifier is varied, in part, by scaling a digital input value to the digital-to-analog converter.

In embodiments, the upstream amplifier has a power-on mode of operation and a power-down mode of operation. In these embodiments, a software control bit can be used to switch between the power-on mode of operation and the power-down mode of operation.

In embodiments, the upstream amplifier operates in a burst mode. The output bursts are controlled using an internal transistor amplifier, a level shifter coupled to an input port of the internal transistor amplifier, and a switch. The switch is used to couple the level shifter to a voltage source (e.g., Vdd) or to a current sink to ground. The upstream amplifier produces an output current proportional to an input current when the switch couples the level shifter to the current sink to ground (burst-on). The output current is turned off when the switch couples the level shifter to the voltage source (burst-off).

In embodiments, the upstream amplifier includes a plurality of switched current mirrors. Typically, at least one of the plurality of switched current mirrors is always enabled during an output burst-on state of the upstream amplifier. In one embodiment, the plurality of switched current mirrors are controlled using a thermometer code. Other codes are used in other embodiments.

In embodiments having a current-mode upstream amplifier, an input signal is coupled to a diode-connected transistor of the upstream amplifier. An internal transistor amplifier is used to reduce the input impedance of the upstream amplifier.

In embodiments, a portion of a bias current of the upstream amplifier is provided by the digital-to-analog converter. This bias current scales along with a bias current of the digital-to-analog converter.

In embodiments of the invention, the upstream amplifier is a type class-A amplifier. In other embodiments, the upstream amplifier is a type class-AB amplifier. A plurality of switched current sources are used in embodiments of the invention to adjust a bias current of the upstream amplifier. The upstream amplifier power consumption scales with the upstream amplifier gain setting and the digital-to-analog converter bias current setting.

In embodiments of the invention, a transformer and a diplexer are used to couple the output ports of the upstream amplifier to a communications means such as a coaxial cable. In embodiments, transformers having a turns ratio of less than 2-to-1 are used. In an embodiment, a center tap of the transformer is connected to a voltage source through a resistor. In an embodiment, a transformer is connected as a Balun.

In one embodiment, a first resistor and a second resistor are coupled between the output ports of the upstream amplifier and a voltage source. In another embodiment, a single resistor is coupled between the two output ports of the upstream amplifier. In some embodiments, these resistors are disposed on the substrate with the upstream amplifier. In other embodiments, the resistors are not integrated.

In one embodiment, the filter coupled between the DAC and the upstream amplifier is an integrated first-order filter. In an embodiment, the integrated filter consists of only resistors and capacitors. In an embodiment, the filter is a current-mode filter having a current input and a current output. In an embodiment, the filter is differential. In an embodiment where the filter in not integrated, the filter is a fifth-order filter having resistors, capacitors, and inductors.

In embodiments of the invention, the DAC is operated at a sampling rate of 200 MHz. In another embodiment, the DAC is operated at a sampling rate of 400 MHz. Other rates are also possible in accordance with the invention.

In accordance with a method embodiment of the invention, an amplified signal is generated as follows. An input current signal is scaled by a scaling factor to form a first intermediate current signal. A bias current is added to the first intermediate current signal to form a second intermediate current signal. The second intermediate current signal is amplified using a plurality of switched current mirrors to form an amplified current signal. The number of switched current mirrors used to amplify the second intermediate current signal is based on a gain control signal. Course gain changes are made in embodiments of the invention by varying the gain control signal. Fine gain changes are made in embodiments of the invention by varying the scaling factor. In an embodiment, the input current signal is formed from a voltage signal. In an embodiment, an amplified voltage signal is formed from the amplified current signal.

In accordance with another method embodiment of the invention, a digital signal is converted to an analog signal as follows. A first analog current signal proportional to a digital input signal is generated. The first analog current signal is scaled by a scaling factor to form a second analog current signal. A bias current is added to the second analog current signal to form a third analog current signal. The third analog current signal is amplified using a plurality of switched current mirrors to form an output analog current signal. The number of switched current mirrors used to amplify the third analog current signal is based on a gain control signal. In embodiments, course gain changes are made by varying the gain control signal. Fine gain changes are made in embodiments by varying the scaling factor. In an embodiment, an output analog voltage signal is formed from the output analog current signal.

Further features and advantages of the present invention, as well as the structure and operation of various embodiments of the present invention, are described in detail below with reference to the accompanying drawings.

BRIEF DESCRIPTION OF THE DRAWINGS/FIGURES

The present invention is described with reference to the accompanying figures. In the figures, like reference numbers indicate identical or functionally similar elements. Additionally, the left-most digit or digits of a reference number identify the figure in which the reference number first appears. The accompanying figures, which are incorporated herein and form part of the specification, illustrate the present invention and, together with the description, further serve to explain the principles of the invention and to enable a person skilled in the relevant art to make and use the invention.

DETAILED DESCRIPTION OF THE INVENTION

Figure 1A:
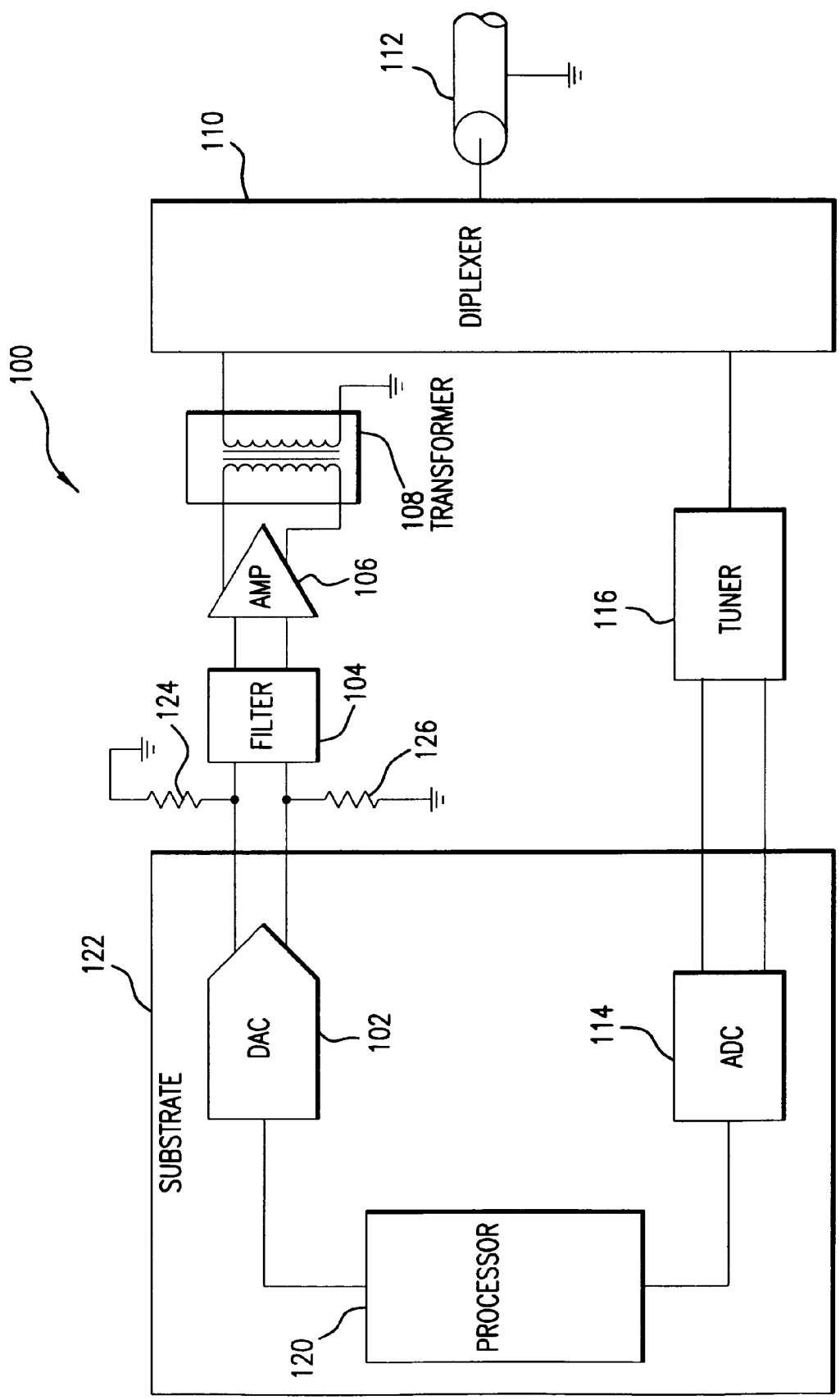
FIG. 1A illustrates a block diagram of a conventional cable modem or cable set-top box system.

FIG. 1 illustrates a block diagram of a cable-modem system or a cable set-top box system (hereinafter system 100). System 100 is a conventional cable-modem system or conventional cable set-top box system. System 100 includes a digital-to-analog converter (DAC) 102, a low-pass filter 104, a cable line-driver/amplifier 106, a transformer 108, a diplexer 110, an analog-to-digital converter (ADC) 114, a tuner 116, and a processor 120.

The DAC 102, the low-pass filter 104, the cable line-driver/amplifier 106, and the transformer 108 are part of an upstream path of system 100. The upstream path is used to send information from the processor 120 to a cable head-end (not shown) over a coaxial cable 112. The tuner 116 and the ADC 114 are part of a downstream path of system 100. The downstream path is used to receive information.

The cable line-driver/amplifier 106 is a voltage-mode amplifier. Cable line-driver/amplifier 106 operates on a voltage input signal. Two resistors 124 and 126 convert an output current signal of the DAC 102 to a voltage signal that can be amplified by the cable line-driver/amplifier 106.

As shown in FIG. 1A, the cable line-driver/amplifier 106 is not integrated on the substrate 122. The cable line-driver/amplifier 106 is a stand-alone chip.

Figure 1B:
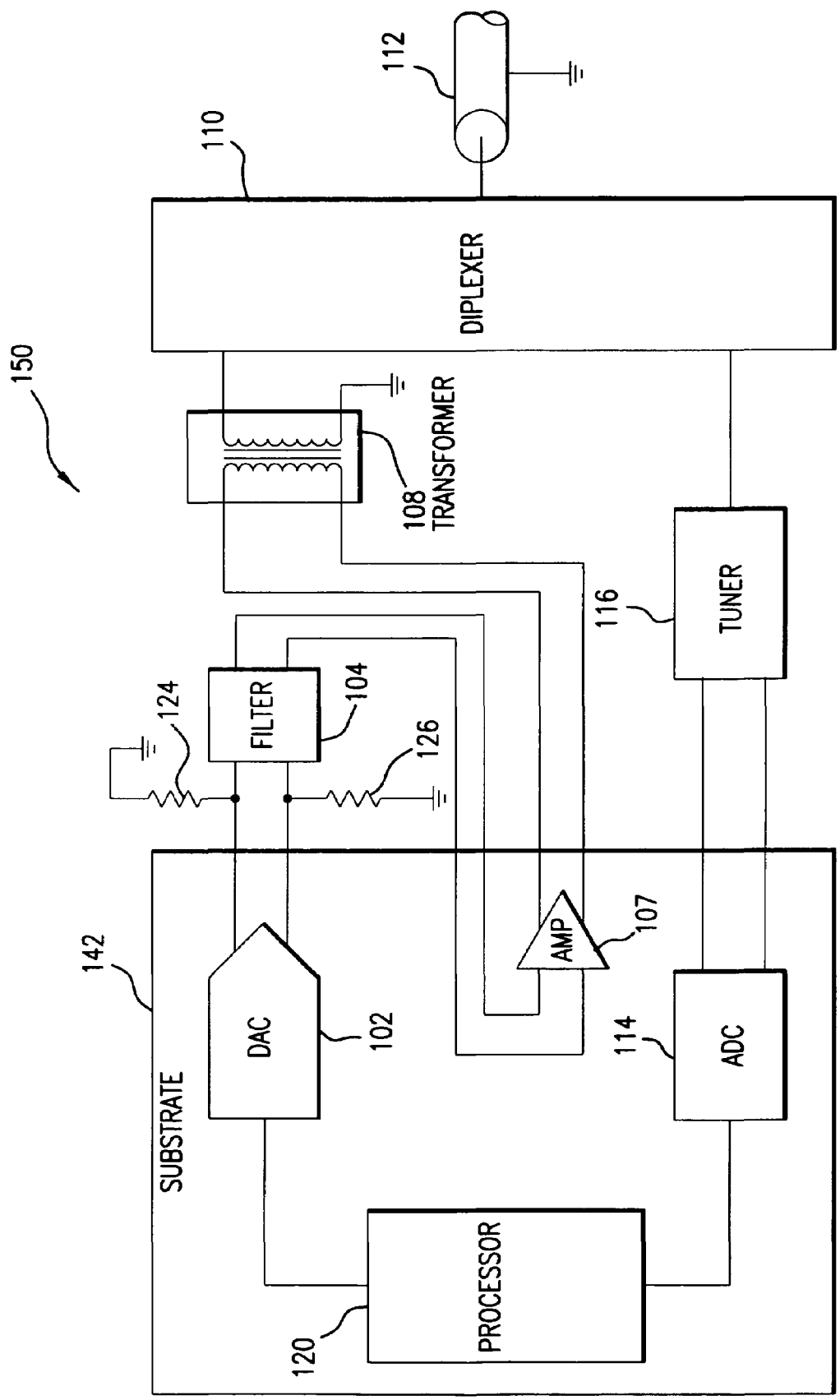
FIG. 1B illustrates a block diagram of a first example embodiment of a cable modem or cable set-top box system according to an embodiment of the invention.

FIG. 1B illustrates a block diagram of an example system 150 according to an embodiment of the invention. System 150 includes a DAC 102, a low-pass filter 104, an integrated upstream amplifier 107, a transformer 108, a diplexer 110, an ADC 114, a tuner 116, and a processor 120.

It is a feature of system 150 that the upstream amplifier 107 is integrated on a substrate 142 with the DAC 102. In addition to other advantages described herein, system 150 eliminates the cost associated with using an external stand-alone amplifier chip. In addition, it reduces the bill of materials cost for support components for the stand-alone cable line-driver/amplifier chip of system 100.

Referring to FIG. 1B, the DAC 102 converts digital information received from the processor 120 into an analog signal. The output signal of the DAC 102 is a current signal. Two resistors 124 and 126 convert the output current signal of the DAC 102 to a voltage signal. In embodiments, the DAC 102 is a 10-bit DAC.

The filter 104 is a low-pass filter. The filter 104 attenuates unwanted frequency components from the voltage signal to produce a desired signal.

The upstream amplifier 107 is a voltage-mode amplifier. Upstream amplifier 107 produces an output voltage signal proportional to an input voltage signal. In embodiments, upstream amplifier 107 includes input and output electrostatic discharge protection.

The transformer 108 couples the upstream amplifier 107 to the diplexer 110. In embodiments, transformer 108 has a turns ratio of 2-to-1.

The diplexer 110 is used to send and receive information signals over cable 112. The diplexer 110 is a combination high-pass filter and low-pass filter. In embodiments, the diplexer 110 operates to allow voltage signals in a frequency range between 5 MHz and 42 MHz to be sent over the cable 112, and to allow voltage signals in a frequency range between 54 MHz and 850 MHz to be received over the cable 112. In other embodiments, other frequency ranges are used to send and receive information.

The tuner 116 is used to select a channel from which information is received. Typically, many different streams of information are sent over the cable 112. Each stream of information is sent in a different channel (e.g., 6 MHz or 8 MHz bandwidth). In embodiments, tuner 116 is used to select a television broadcast from among hundreds of television broadcasts sent over cable 112. In embodiments, the tuner 116 is used to select a channel used to download information from the INTERNET.

The ADC 114 converts information received by the tuner 116 from an analog form to a digital form that can be processed by the processor 120.

The processor 120 is any device capable of processing digital information. The processor 120 can be, for example, a computer processor, a cable-modem processor, or a cable set-top box processor. In embodiments, the processor 120 performs such functions as QAM or QPSK modulation and demodulation. In embodiments, the processor 120 is integrated on the substrate 122.

In operation, system 150 performs as follows. To transmit information, the processor 120 sends a digital signal to the DAC 102. The DAC 102 converts the digital signal to an analog current signal. This analog current signal is converted to an analog voltage signal by the resistors 124 and 126. Unwanted images generated by the DAC 102 are removed from the analog voltage signal by the low-pass filter 104. The filtered analog voltage signal is amplified by upstream amplifier 107. The output of upstream amplifier is a voltage signal. This voltage signal is coupled to a communications means such as, for example, coaxial cable 112 by the transformer 108 and the diplexer 110. To receive information, an information signal from a communications means such as, for example, coaxial cable 112 is coupled to the tuner 116. Tuner 116 is used to receive information from one of the channels of information carried by the communications means such as, for example, coaxial cable 112. The output of the tuner 116 is converted to a digital signal by the ADC 114 and sent to the processor 120.

Figure 2A:
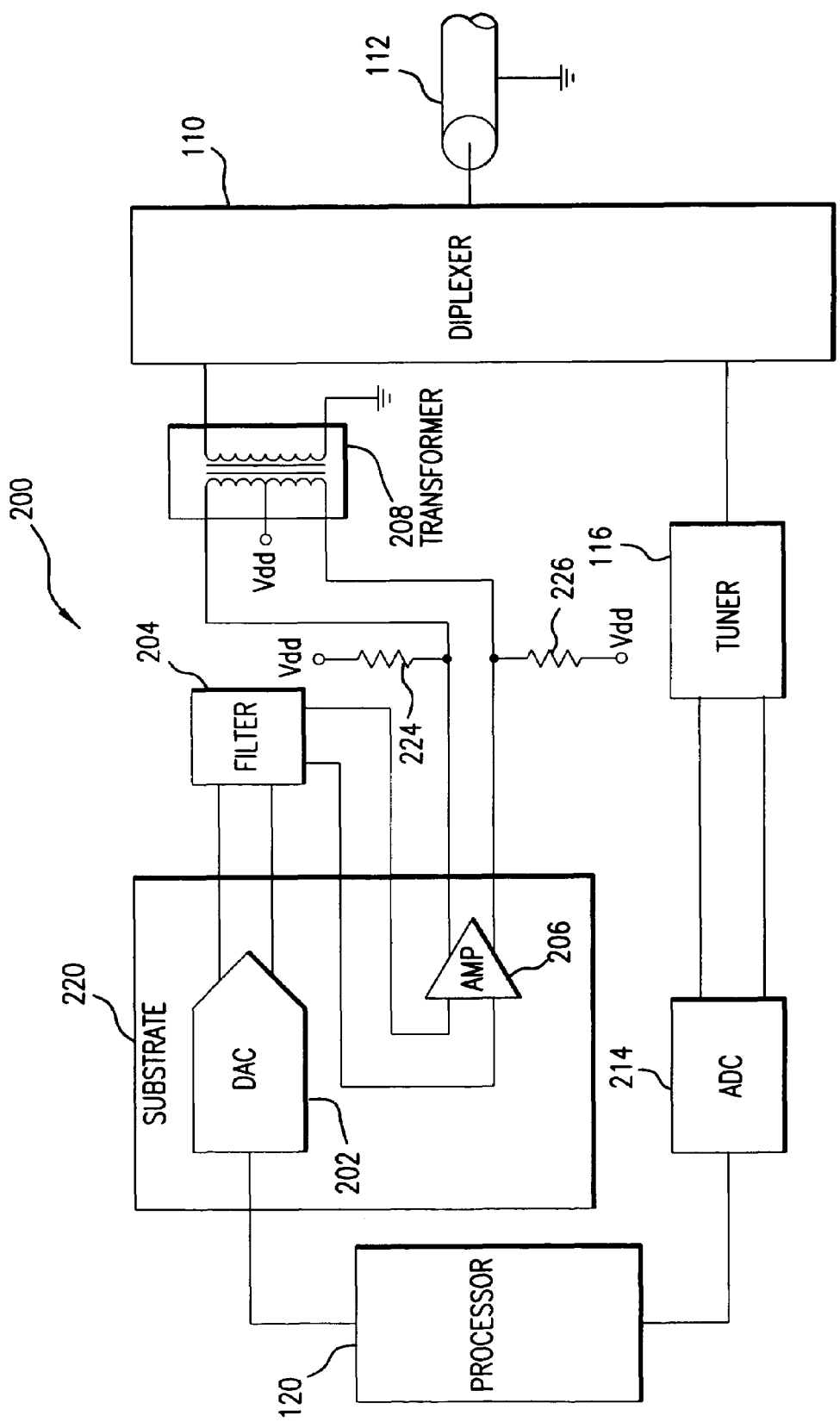
FIG. 2A illustrates a block diagram of a second example embodiment of a cable modem or cable set-top box system according to an embodiment of the invention.

FIG. 2A illustrates a block diagram of an example system 200 according to an embodiment of the present invention. System 200 has a DAC 202, a filter 204, a current-mode upstream amplifier 206, two resistors 224 and 226, a transformer 208, a diplexer 110, a tuner 116, an ADC 214, and a processor 120. The upstream amplifier 206 is integrated on a substrate 220 along with the DAC 202. Substrate 220 can be any substrate. For example, in embodiments, substrate 220 is a CMOS substrate such as, for example, 0.18 um CMOS. In other embodiments, substrate 220 is BiCMOS, Bipolar, or GaAs.

In embodiments, the DAC 202 is a 10-bit DAC similar to the type described by Lin et al. in "A 10-b, 500-MSample/s CMOS DAC in 0.6 mm$^2$," which is incorporated herein by reference in its entirety. See Chi-Hung Lin et al., A 10-b, 500-MSample/s CMOS DAC in 0.6 mm$^2$, in IEEE Journal of Solid-State Circuits, Vol. 33, No. 12, IEEE, pages 1948–58 (December 1998). The DAC 202 samples input signals from the processor 120 and generates a differential current signal. This differential current signal is filtered and provided to the upstream amplifier 206 after filtering by low-pass filter 204 to remove unwanted images of a desired signal. In embodiments, the DAC 202 samples input signals from the processor 120 at a sample rate of 200 MHz or 400 MHz. Other sample rates are used in other embodiments.

The filter 204 operates on the differential current output by the DAC 202 and removes images generated by the sampling process of the DAC 204. In embodiments, filter 204 is a fifth-order, Chebyshev Type 2, LC ladder filter. Filter 204 is described in more detail below with reference to FIGS. 9A and 9B.

The upstream amplifier 206 operates on the input current signal from the DAC 202 and produces an amplified output current signal. This output current signal is converted to a voltage signal by the resistors 224 and 226 and provided to the input terminals of the transformer 208. In embodiments, the upstream amplifier 206 is a type class-A design that uses a variable internal bias current. In other embodiments, the upstream amplifier 206 is a type class-AB design.

The upstream amplifier 206 receives additional bias current from the DAC 202. This additional bias current scales along with the DAC's full-scale current swing. As the DAC's output current scales down, or as the upstream amplifier's gain is reduced, the upstream amplifier's total quiescent current reduces thereby reducing power consumption. As described in more detail below with reference to FIG. 12, upstream amplifier 206 is a variable-gain amplifier.

The transformer 208 produces a single-ended output voltage signal proportional to the voltage signal present at its input terminals. This single-ended output voltage signal is coupled to a cable 112, or other communications means, by the diplexer 110. The transformer 208 has a center tap that is coupled, either directly or through a resistor, to a voltage source (e.g., Vdd). In embodiments of the invention, the transformer 208 has a nominal turns ratio of less than 2-to-1 such as, for example, 1-to-1 or 1.5-to-1.

The remaining components of system 200 are similar to corresponding components described above with regards to system 150.

As shown in FIG. 2A, system 200 also eliminates the stand-alone cable line-driver/amplifier chip of system 100. The integration of the upstream amplifier 206 and the DAC 202 that drives upstream amplifier 206 on the substrate 220 allows for greater freedom in the architecture of upstream amplifier 206. This integration also allows for greater flexibility and controllability of the upstream path of system 200. This occurs because the upstream path is completely under the control of the chip designer, and therefore no special provisions need to be made for use of various vendors' external cable line-drivers/amplifiers.

In operation, system 200 performs as follows. To transmit information, the processor 120 sends a digital signal to the DAC 202. The DAC 202 converts the digital signal to an analog current signal. This analog current signal is filtered by the low-pass filter 204 to remove any unwanted images generated by the DAC 202. The filtered analog current signal is amplified by upstream amplifier 206. The output of the upstream amplifier 206 is a current signal. The output current signal of the upstream amplifier 206 is converted to a voltage signal by the resistors 224 and 226. This voltage signal is coupled to a communications means such as, for example, coaxial cable 112 by the transformer 208 and the diplexer 110. To receive information, an information signal from a communications means such as, for example, coaxial cable 112 is coupled to the tuner 116. Tuner 116 is used to receive information from one of the channels of information carried by the communications means such as coaxial cable 112. The output of the tuner 116 is converted to a digital signal by the ADC 114 and sent to the processor 120.

Figure 2B:
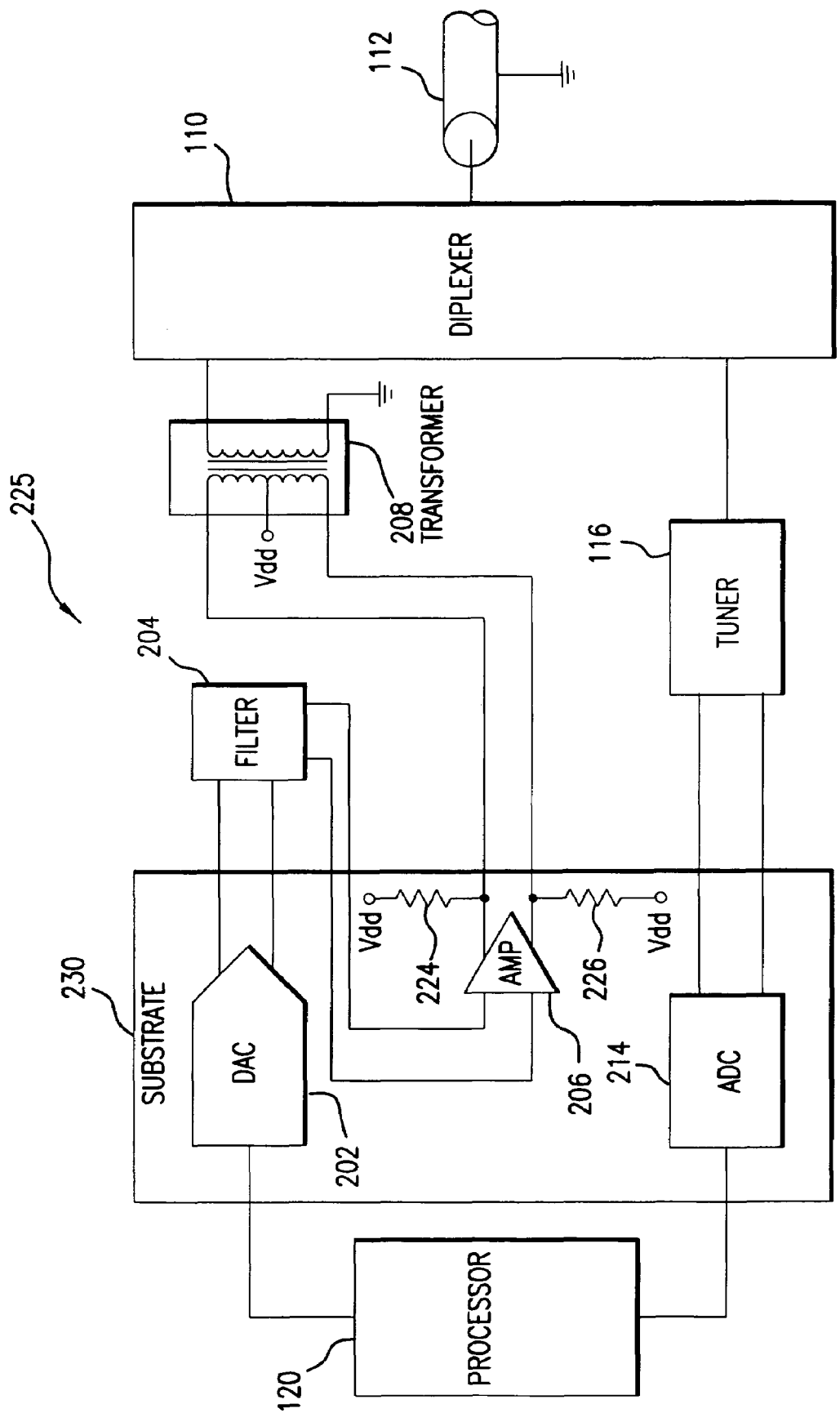
FIG. 2B illustrates a block diagram of a third example embodiment of a cable modem or cable set-top box system according to an embodiment of the invention.

FIG. 2B illustrates a block diagram of an example system 225 according to an embodiment of the present invention. System 225 is similar to system 200. In system 225, the ADC 214 and the resistors 224 and 226 have been integrated along with the DAC 202 and the upstream amplifier 206 on a substrate 230.

Figure 2C:
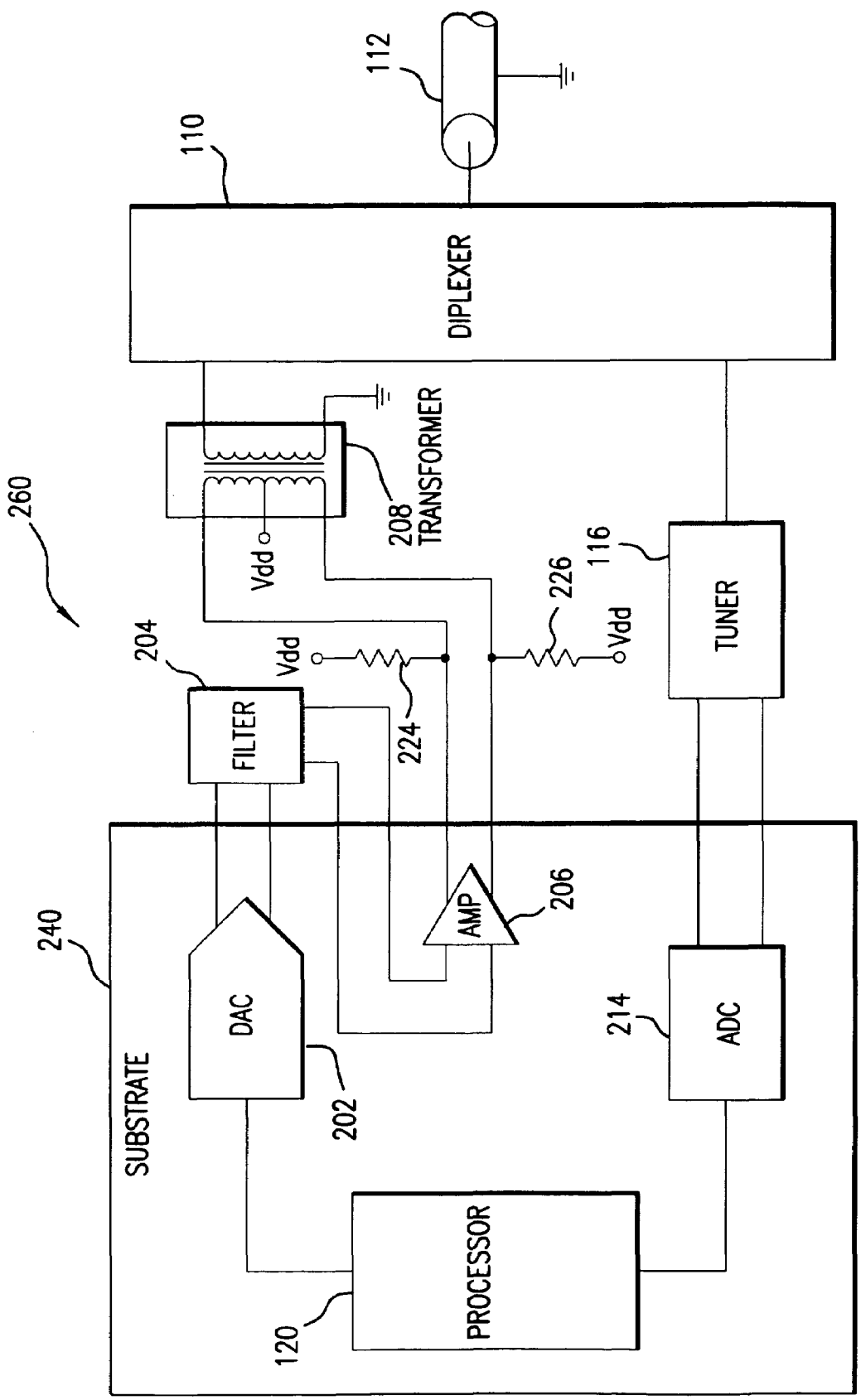
FIG. 2C illustrates a block diagram of a fourth example embodiment of a cable modem or cable set-top box system according to an embodiment of the invention.

FIG. 2C illustrates a block diagram of an example system 260 according to an embodiment of the present invention. System 260 is also similar to system 200 and system 225. In system 260, the processor 120 and the ADC 214 have been integrated along with the DAC 202 and the upstream amplifier 206 on a substrate 240.

Figure 3A:
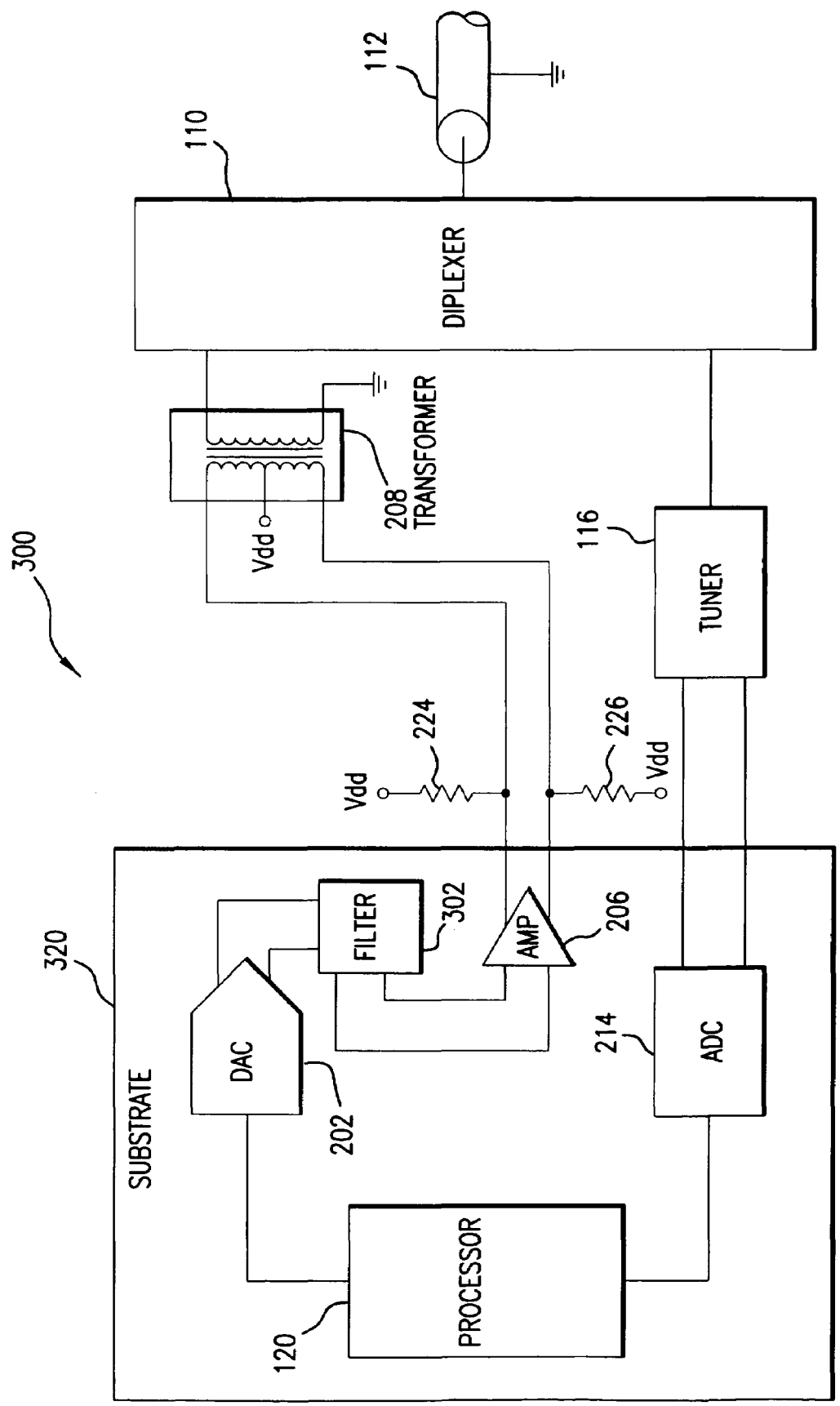
FIG. 3A illustrates a block diagram of a fifth example embodiment of a cable modem or cable set-top box system according to an embodiment of the invention.

FIG. 3A is a block diagram of an example system 300 according to an embodiment of the present invention. System 300 is similar to system 260. System 300 has a processor 120, a DAC 202, a filter 302, a current-mode upstream amplifier 206, a transformer 208, a diplexer 110, a tuner 116, and an ADC 214.

As shown in FIG. 3A, the processor 120, the DAC 202, the upstream amplifier 206, the filter 302, and the ADC 214 are integrated on a substrate 320. In some embodiments, the resistors 224 and 226 are also integrated on the substrate 320. Substrate 320 can be any substrate. For example, in embodiments, substrate 320 is a CMOS substrate such as, for example, 0.13 um CMOS. In other embodiments, substrate 320 is BiCMOS, Bipolar, or GaAs.

Clocking the DAC 202 at a rate such as, for example, 400 MHz reduces the complexity of the filter 302 needed to remove unwanted images. Clocking the DAC 202 at higher rates moves the unwanted images to higher frequencies and reduces their size. In embodiments, filter 302 is a first-order, low-pass RC filter. The filter 302 is described in more detail below with regards to FIG. 10.

The other components of cable-modem system 300 operate in a manner similar to that described above for the other example system embodiments of the invention.

Figure 3B:
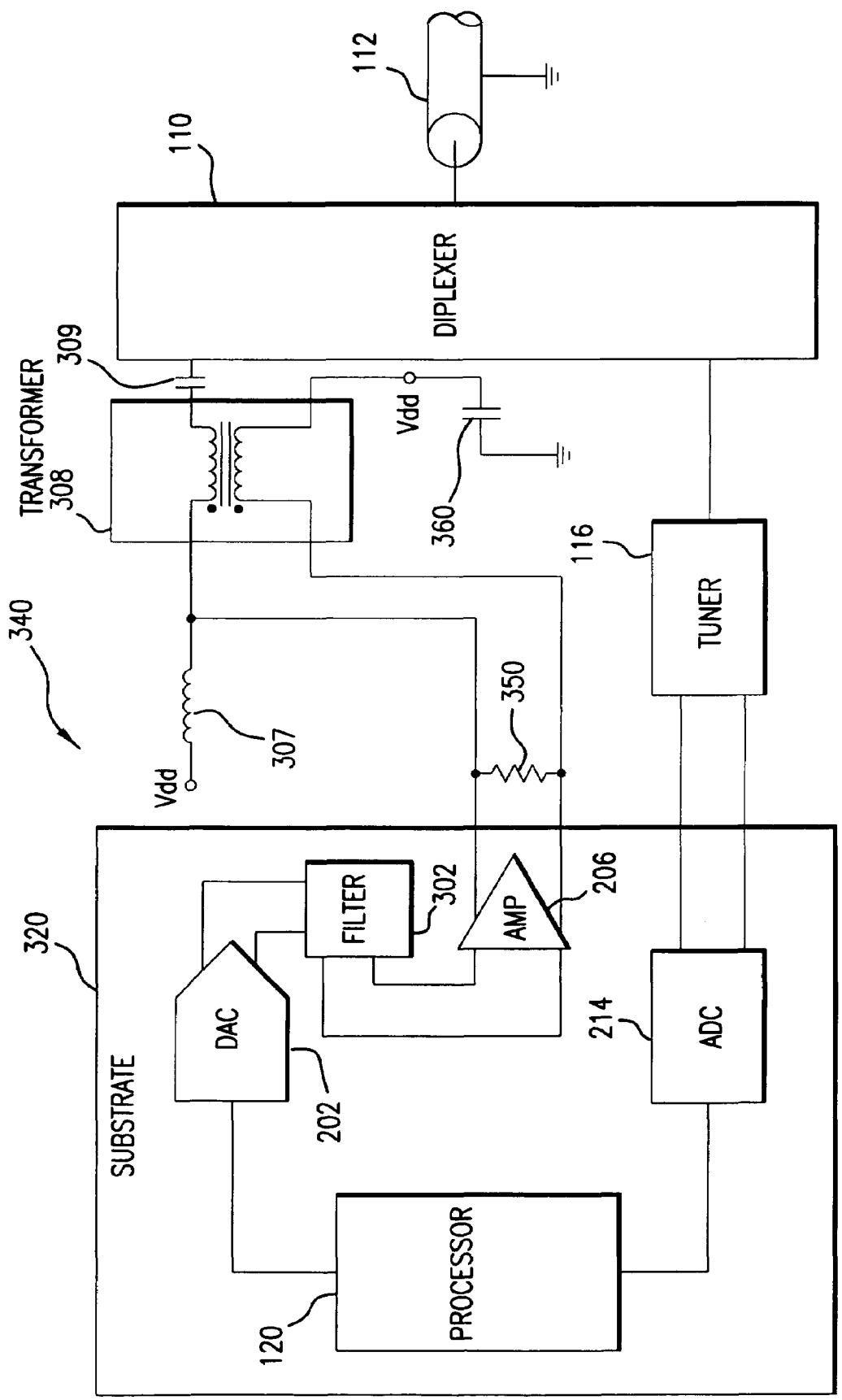
FIG. 3B illustrates a block diagram of a sixth example embodiment of a cable modem or cable set-top box system according to an embodiment of the invention.

FIG. 3B is a block diagram of an example system 340 according to an embodiment of the present invention. System 340 is similar to system 300. System 340 has a processor 120, a DAC 202, a filter 302, a current-mode upstream amplifier 206, a radio frequency choke 307, a transformer 308, a capacitor 309, a diplexer 110, a tuner 116, and an ADC 214.

The transformer 308 is connected as a Balun. The transformer 308 couples the output signal of the upstream amplifier 206 to the diplexer 110. A radio frequency choke 307 couples an input tap of the transformer 308 to a voltage source (e.g., Vdd). A dc blocking capacitor 309 is coupled between the transformer 308 and the diplexer 110. In an embodiment, a capacitor 360 is coupled to a tap of the transformer via a voltage source (e.g., Vdd), as illustrated in FIG. 3B.

A resistor 350 is coupled between the two coils of the transformer 308 that are coupled to the output ports of the upstream amplifier 206. The resistor 350 is used to convert the output current signal of the upstream amplifier 206 to a voltage signal. In embodiments, the resistor 350 is replaced by the resistors 224 and 226. In embodiments, the resistor 350 is used with the transformer 208, as the transformer 208 is configured in FIG. 3A. In some embodiments, the resistor 350 has a nominal value of between 75 Ohms and 220 Ohms. These values are only illustrative, and not intended to limit the invention.

As shown in FIG. 3B, the processor 120, the DAC 202, the upstream amplifier 206, the filter 302, and the ADC 214 of system 340 are integrated on a substrate 320. In some embodiments, the resistor 350 is also integrated on the substrate 320.

As illustrated by the system embodiments above, the present invention contemplates a wide variety of different levels of integration and arrangements of the components that make up the systems of the invention.

Figure 4:
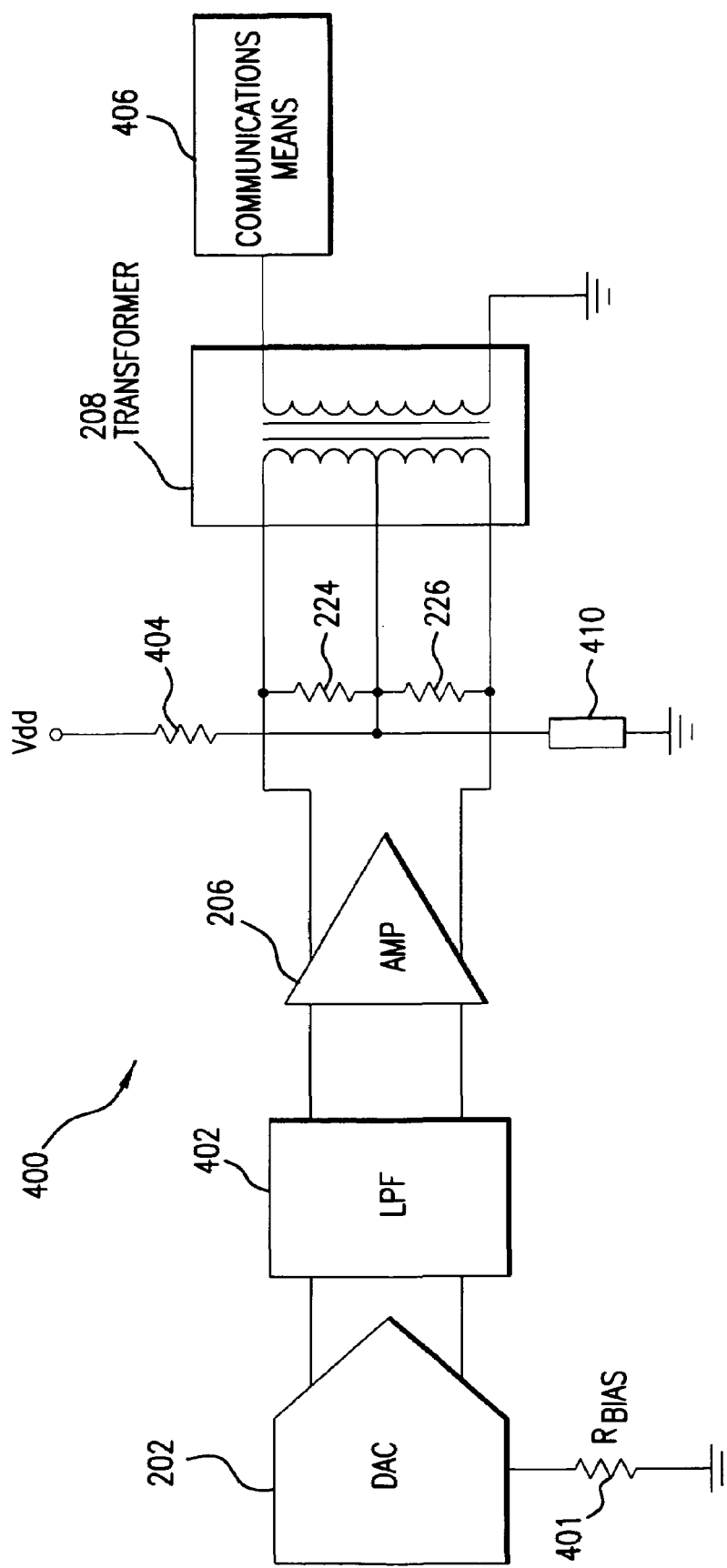
FIG. 4 illustrates a block diagram of an upstream path of a cable modem or cable set-top box system according to an embodiment of the invention.

FIG. 4 illustrates a block diagram of a generalized upstream processing path 400 according to embodiments of the invention such as, for example, the upstream paths of system 260 and system 300 described above. Upstream processing path 400 will be used to further described features of the invention.

Upstream processing path 400 includes a DAC 202, a bias resistor 401 ($R_{BIAS}$), a low-pass filter 402, an upstream amplifier 206, a transformer 208, three resistors 224, 226, and 404, and an impedance device 410. In a preferred embodiment, upstream processing path 400 generally functions as follows. The DAC 202 converts a digital information signal into a differential current signal. The filter 402 operates on the differential current output by the DAC 202 and removes images generated by the sampling process of the DAC 202. Upstream amplifier 206 is a current-mode amplifier that amplifies the differential currents generated by the DAC 202. The output of upstream amplifier 206 is a differential current signal. The two resistors 224 and 226, along with the loading of the transformer 208 primary coil, convert this differential current signal to a voltage signal that is provided to the input terminals of transformer 208. The transformer 208 converts the voltage signal to a single-ended voltage signal that drives a communications means 406 such as, for example, a coaxial cable or a twisted-pair cable. The resistor 404 is used to control the voltage at a center tap of transformer 208. In embodiments, impedance device 410 is a capacitor or a varistor.

In embodiments, upstream processing path 400 is designed to drive a 75 Ohm coaxial cable. In these embodiments, transformer 208 typically has a turns ratio of less than 2-to-1. Using resistors 224 and 226 that have a value greater than 37.5 Ohms (i.e., the value needed with a 1-to-1 transformer 208 to match the impedance of a 75 Ohm coaxial cable) allows the upstream processing path 400 to trade output return loss for more gain and less power. In embodiments, resistor values up to about 112 Ohms and 75 Ohms may be used while still meeting industry cable modem and cable set-top box performance specifications, respectively.

In an embodiment, the current gain of upstream amplifier 206 can be controlled from a minimum of 0.25× to a maximum of 16×. Using power-of-two gain steps from a gain of 16× down to a gain of 0.25× provides a range of about 36 dB.

Each of the components of upstream processing path 400 will now be described in more detail.

Figure 5:
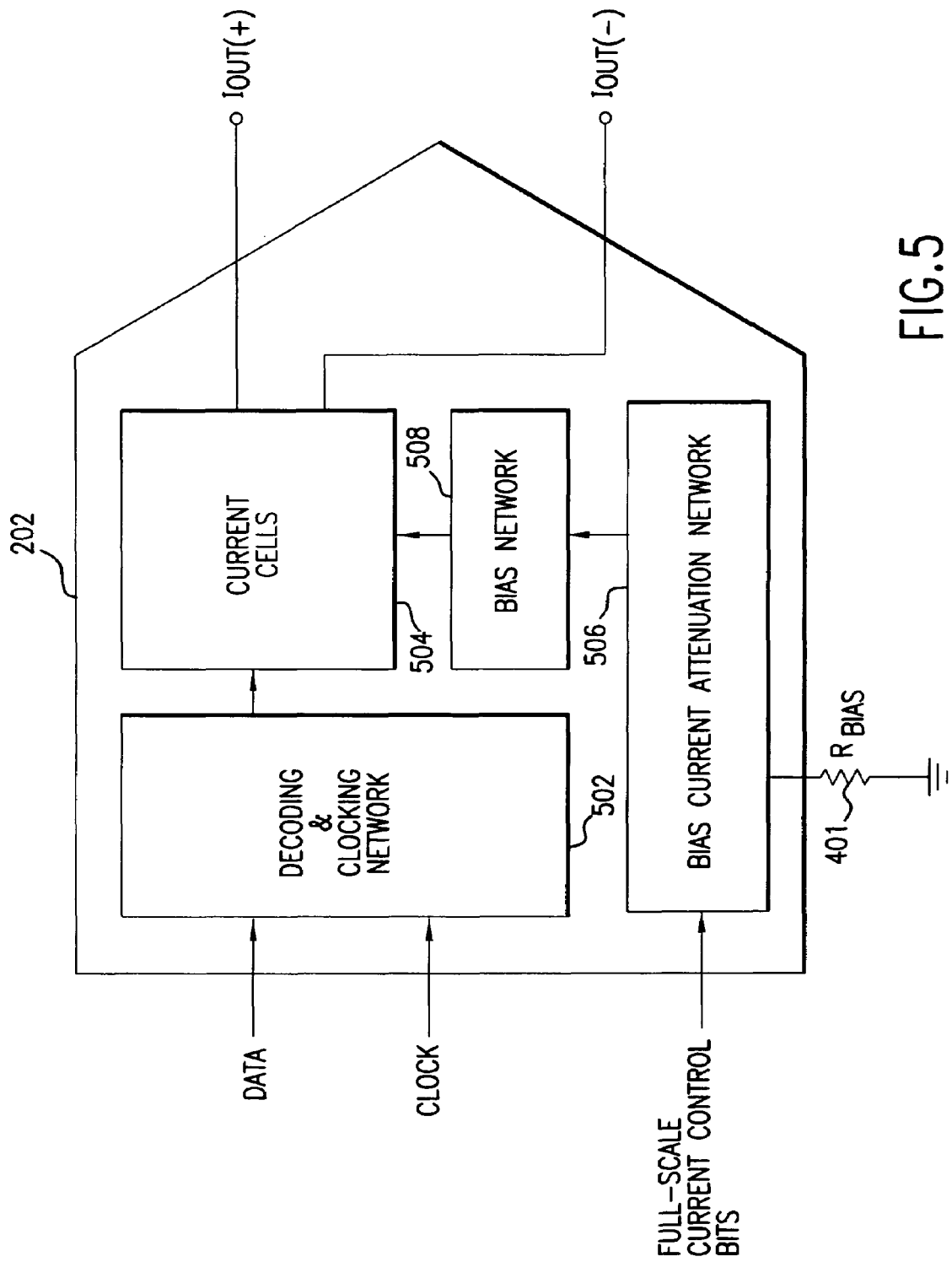
FIG. 5 illustrates a block diagram of an example digital-to-analog converter used in embodiments of the invention.

FIG. 5 is a block diagram of an example DAC 202 according to embodiments of the present invention. The DAC 202 includes a data and clocking network 502, a plurality of current cells 504, a bias current attenuation circuit 506, a bias network 508, and a bias resistor ($R_{BIAS}$) 401.

The decoding and clocking network 502 receives digital information bits and a clocking signal. The decoding and clocking network 502 decodes the received digital information bits. The decoded information bits are used to determine how many current cells 504 are to be enabled to produce an output current signal. The received clocking signal controls the sampling rate of the DAC 202.

In embodiments of the invention, the DAC 202 is a 10-bit current steering CMOS digital-to-analog converter. In one embodiment, the DAC 202 operates on the eight most significant bits (MSB's) and the two least significant bits (LSB's) of a ten bit data word separately, as described by Lin et al. in "A 10-b, 500-MSample/s CMOS DAC in 0.6 mm$^2$."

In an embodiment, the DAC 202 is optimized for frequency domain applications. For sampling frequencies up to 200 mega-samples/second, the spurious free dynamic range of DAC 202 is better than 60 dB for signals from dc to one-half the sampling frequency. In an embodiment, for sampling frequencies up to 400 mega-samples/second, the spurious free dynamic range of DAC 202 is better than 55 dB for signals from dc to one-half the sampling frequency. In embodiments, the measured differential nonlinearity and integral nonlinearity are 0.1 least significant bit (LSB) and 0.2 LSB, respectively.

The received full-scale current control bits are used by the bias current attenuation network 506 and the bias network 508 to set the current level generated by each of the plurality of current cells 504. The external resistor 401 establishes the maximum possible full-scale current that can be produced by the DAC 202.

Figure 6:
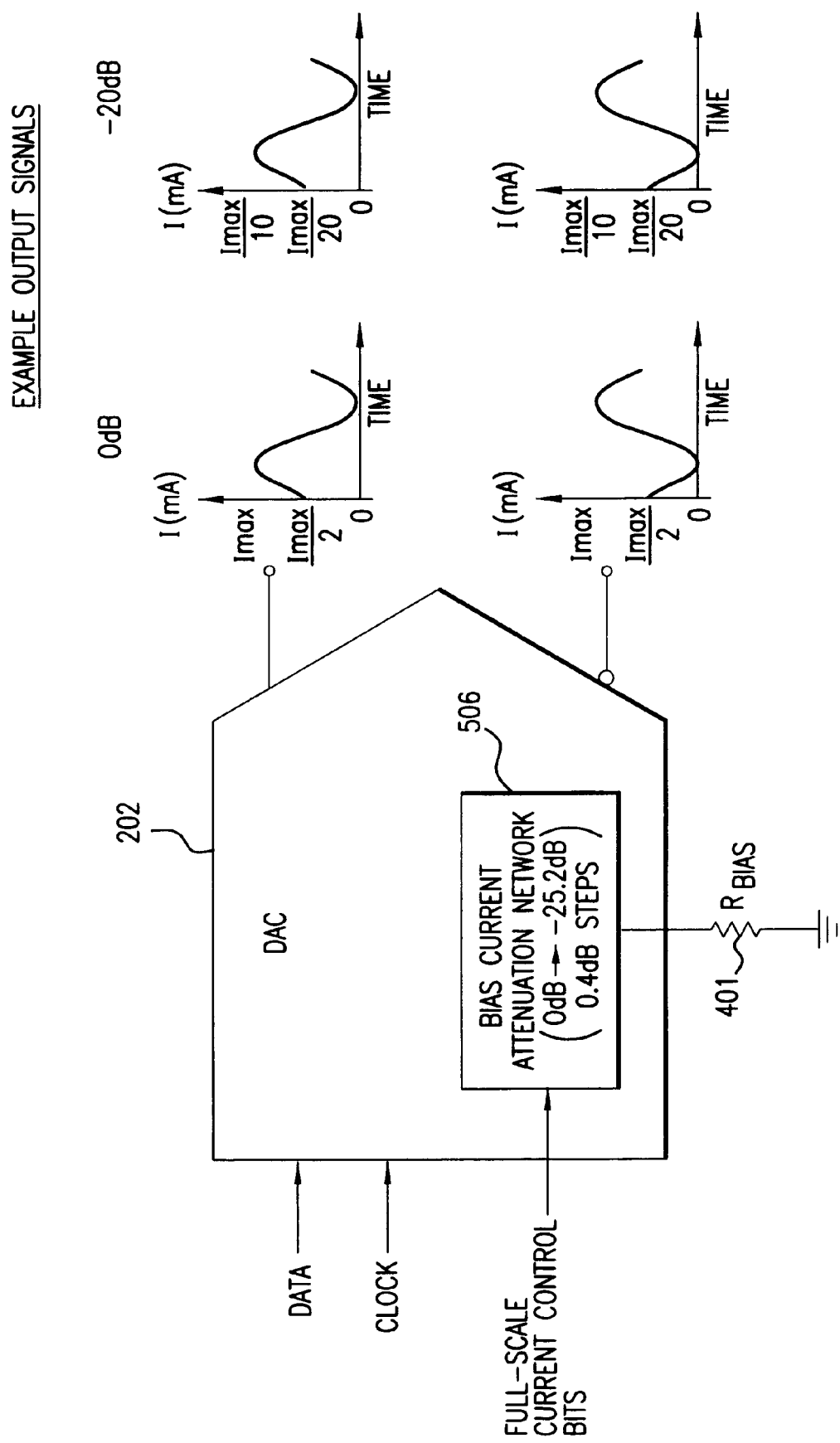
FIG. 6 illustrates example output signals for the example digital-to-analog converter of FIG. 5.

FIG. 6 illustrates example output signals generated by the DAC 202 in embodiments of the invention. A DAC 202 bias current is set by the bias resistor 401. This bias current can be attenuated from 0 dB to 25.2 dB (in 0.4 dB steps) by a digitally controlled bias current attenuation network 506. The resulting attenuated bias current is used as a reference to set the full-scale output current of the DAC 202.

In an embodiment, a six-bit code word is used to control the operation of the bias current attenuation network 506 and the bias network 508. Using a six-bit code word and a current step size of 0.4 dB, an attenuation of 25.2 dB can be achieved by using 3.2 dB coarse attenuation control blocks and 0.4 dB fine attenuation control blocks. See, e.g., Chi-Hung Lin, A 10-b, 500-MSample/s CMOS DAC in 0.6 mm$^2$, a dissertation submitted to the University of California, Los Angeles in partial satisfaction of the requirements for the degree Doctor of Philosophy in Electrical Engineering, pages 1–137 (1998), which is incorporated herein by reference in its entirety.

Figure 7:
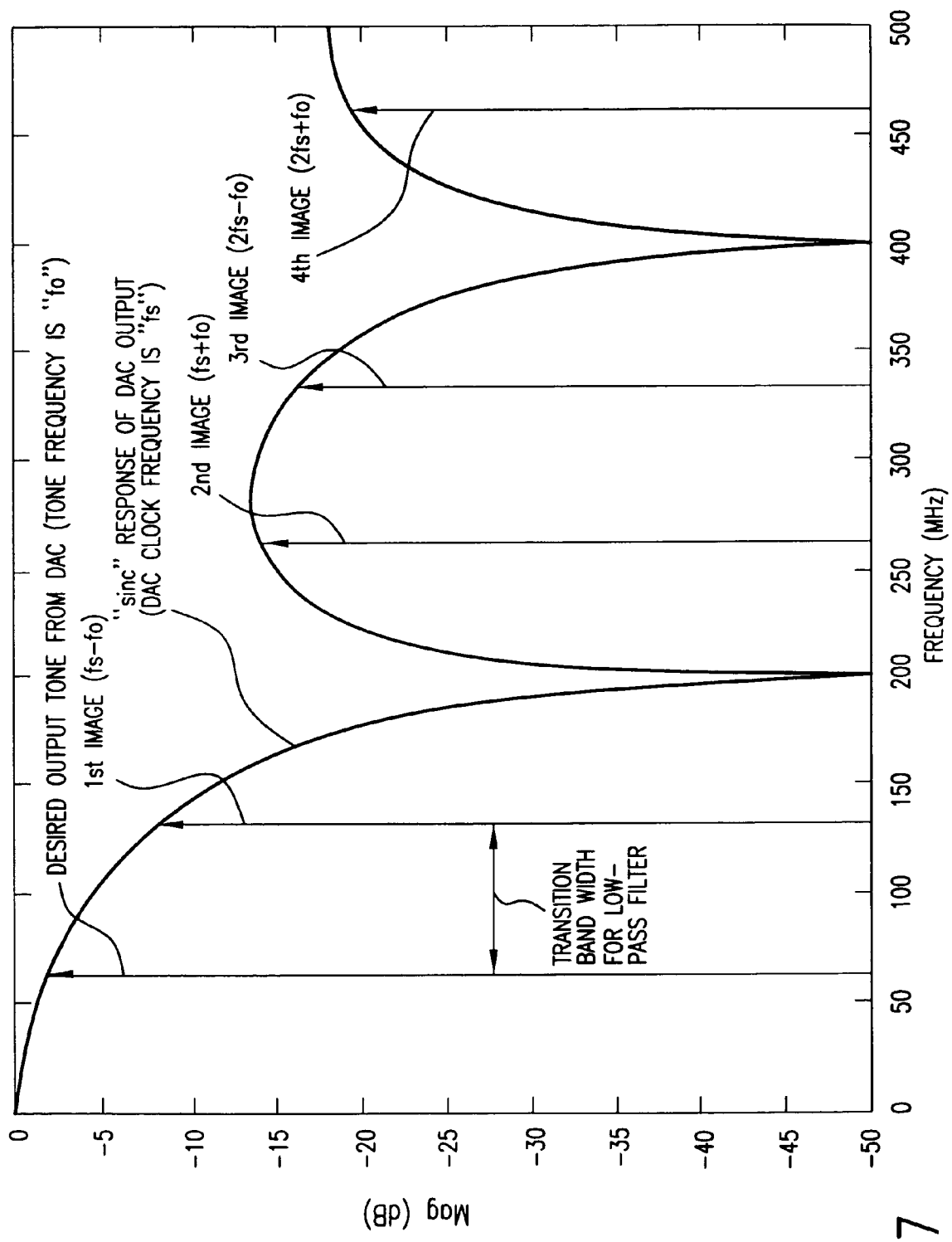
FIG. 7 illustrates a desired output tone and the images produced by the digital-to-analog converter of FIG. 5 when the digital-to-analog converter is operated at a sampling rate of 200 mega-samples/second.

In embodiments of the invention, the DAC 202 is operated at different sampling frequencies (rates). FIG. 7 illustrates the location of a desired tone and the first, the second, the third, and the fourth images generated by the DAC 202 when the DAC 202 is operated at 200 MHz. FIG. 7 also shows the transition band width between the desired tone and the first image when the DAC 202 is operated at 200 MHz.

Figure 8:
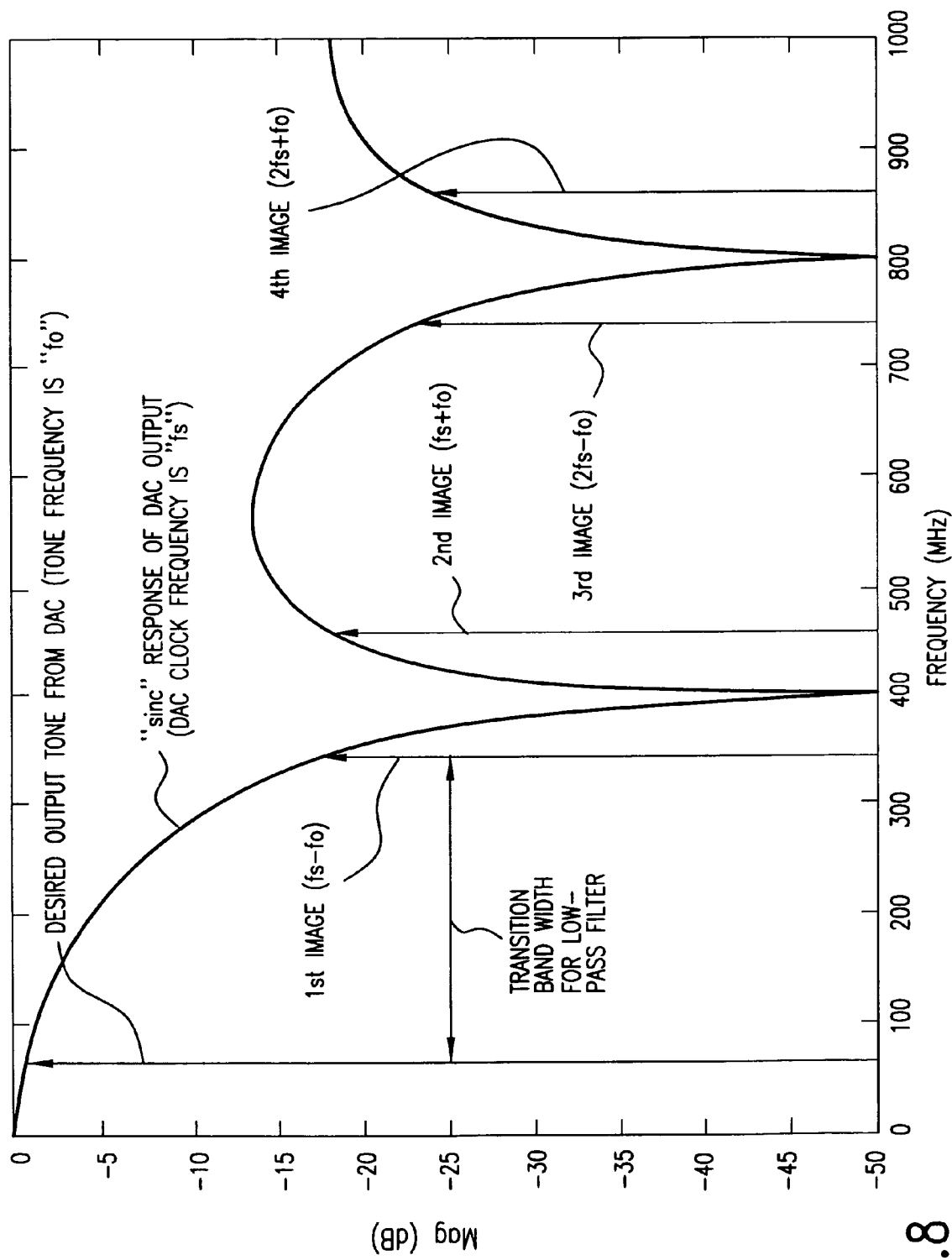
FIG. 8 illustrates a desired output tone and the images produced by the digital-to-analog converter of FIG. 5 when the digital-to-analog converter is operated at a sampling rate of 400 mega-samples/second.

FIG. 8 illustrates the location of a desired tone and the first, the second, the third, and the fourth images generated by the DAC 202 when the DAC 202 is operated at 400 MHz. As can be seen by comparing FIG. 8 to FIG. 7, the transition band width between the desired tone and the first image when the DAC 202 is operated at 400 MHz is larger than the transition band width between the desired tone and the first image when the DAC 202 is operated at 200 MHz. As can also be seen by comparing FIG. 8 to FIG. 7, the amplitudes of the images are smaller. This is also the case if the signal is modulated (e.g., using QAM or QPSK). Operating the DAC 202 at a higher rate reduces the complexity of the low-pass filter 402 needed to remove unwanted images generated by the DAC 202.

Figure 9A:
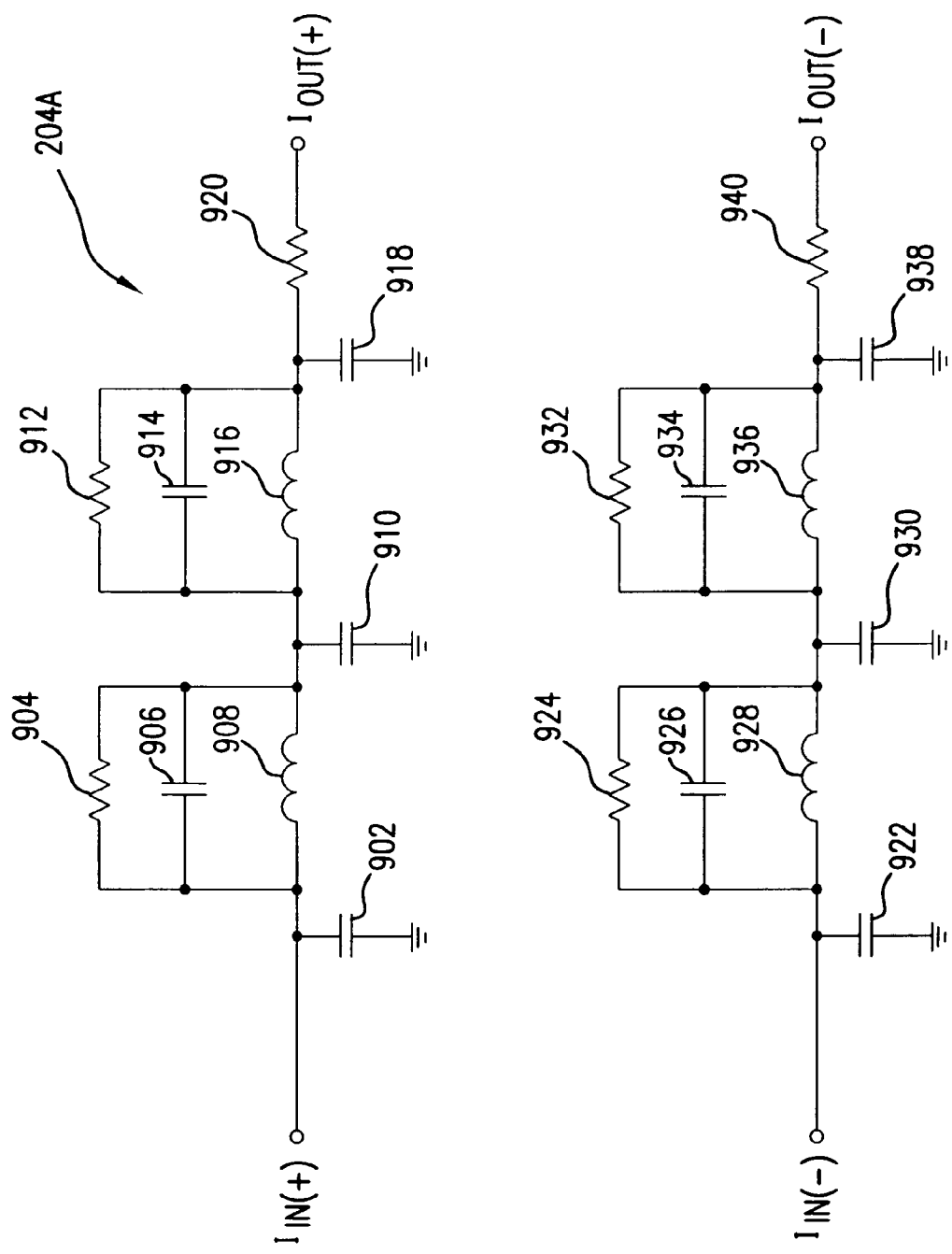
FIG. 9A illustrates an first example filter according to an embodiment of the invention.

FIG. 9A illustrates a first example low-pass filter 204A that is used in embodiments of the invention. The example filter 204A shown in FIG. 9A is intended to be implemented as an off-chip filter (i.e., it is not intended to be integrated on the substrate with the DAC 202 and the upstream amplifier 206).

Example filter 204A is a two-leg (differential) filter formed from two one-leg (single-ended) filters. The first leg of filter 204A includes five capacitors 902, 906, 910, 914, and 918, three resistors 904, 912, and 920, and two inductors 908 and 916. The resistors 904 and 912 are optional. The second leg of filter 204A includes five capacitors 922, 926, 930, 934, and 938, three resistors 924, 932, and 940, and two inductors 928 and 936. The resistors 924 and 932 are optional. Each leg of example filter 204A is a fifth-order, Chebyshev Type 2, LC ladder filter.

The resistors 920 and 940 are selected to increase the series impedance between the output of the DAC 202 and the input of the upstream amplifier 206. In embodiments having a current-mode upstream amplifier 206, the upstream amplifier 206 input impedance is small and variable. Thus, by adding series resistors 920 and 940, the input impedance of the upstream amplifier 206 appears nearly constant to the DAC 202 if the resistance of resistors 920 and 940 are large compared to the input impedance of the upstream amplifier 206 (i.e., the filter sees approximately constant termination impedance). However, the resistors 920 and 940 cannot be too large or the DAC 202 may suffer from headroom problems.

In one embodiment, the approximate values for example filter 204A are as follows: the capacitors 902 and 922 equal 120 pF; the capacitors 906 and 926 equal 25 pF; the capacitors 910 and 930 equal 98 pF; the capacitors 914 and 934 equal 19 pF; the capacitors 918 and 938 equal 10 pF; the resistors 904, 912, 924 and 932 equal 1,000 Ohms; the resistors 920 and 940 equal 15 Ohms; the two inductors 908 and 928 equal 45 nH; and the two inductors 916 and 936 equal 22 nH. These values are illustrative, and not intended to limit the invention.

Figure 9B:
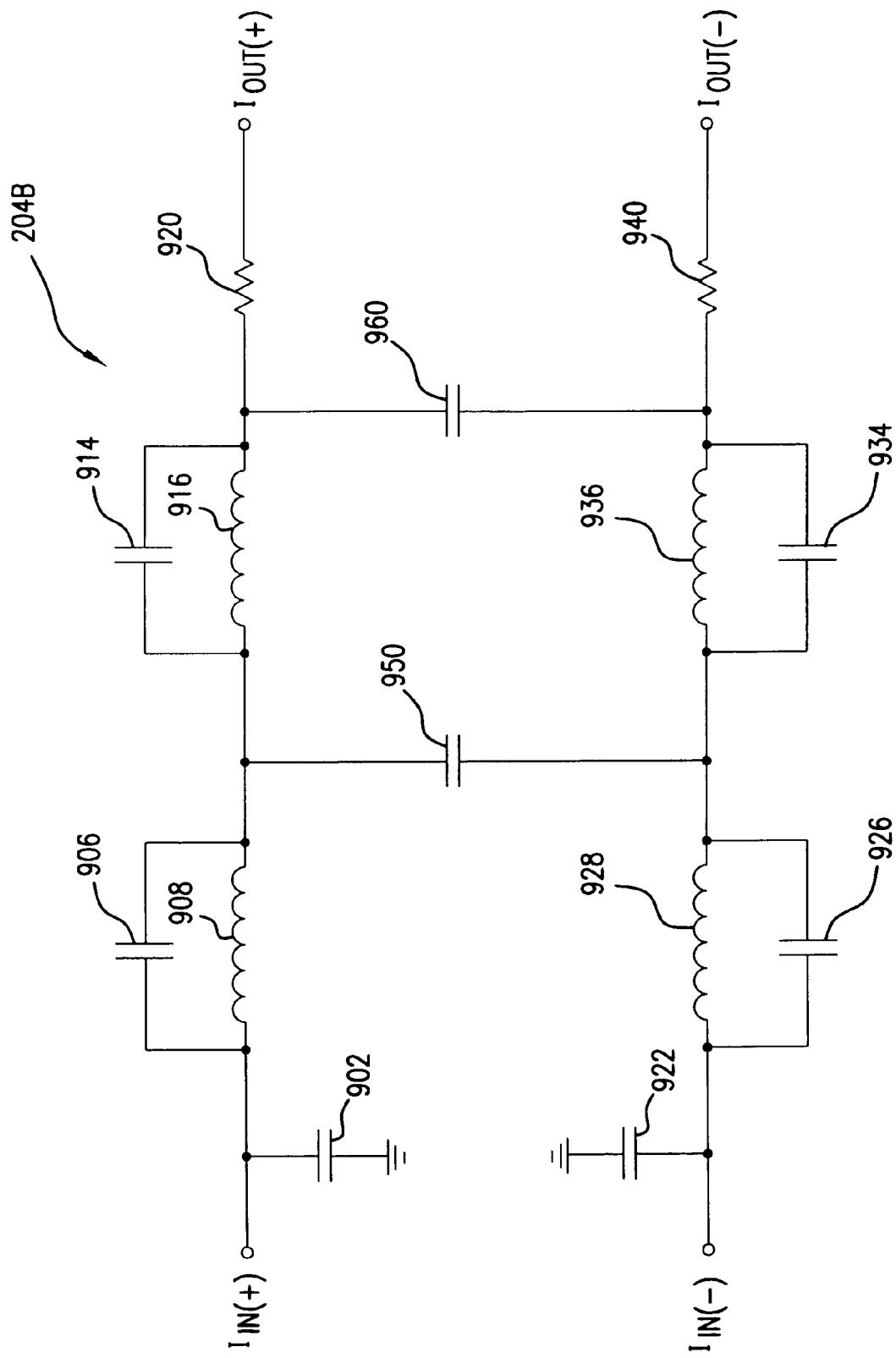
FIG. 9B illustrates a second example filter according to an embodiment of the invention.

FIG. 9B illustrates a second example filter 204B according to an embodiment of the invention. The example filter 204B is similar to example filter 204A except that some of the capacitors have been combined to form a coupling between the two legs of filter 204A. As shown in FIG. 9B, the capacitors 910 and 930 of filter 204A have been replaced by a capacitor 950. The capacitors 918 and 938 of filter 204A have been replaced by a capacitor 960. In another embodiment, the capacitors 902 and 922 are combined.

In an embodiment of filter 204B, the capacitor 950 has a value equal to about 49 pF. The capacitor 960 has a value equal to about 5 pF. The values of the other components are the same as those listed above for the example embodiment of filter 204A. These values are only illustrative, and not intended to limit the invention.

Figure 10:
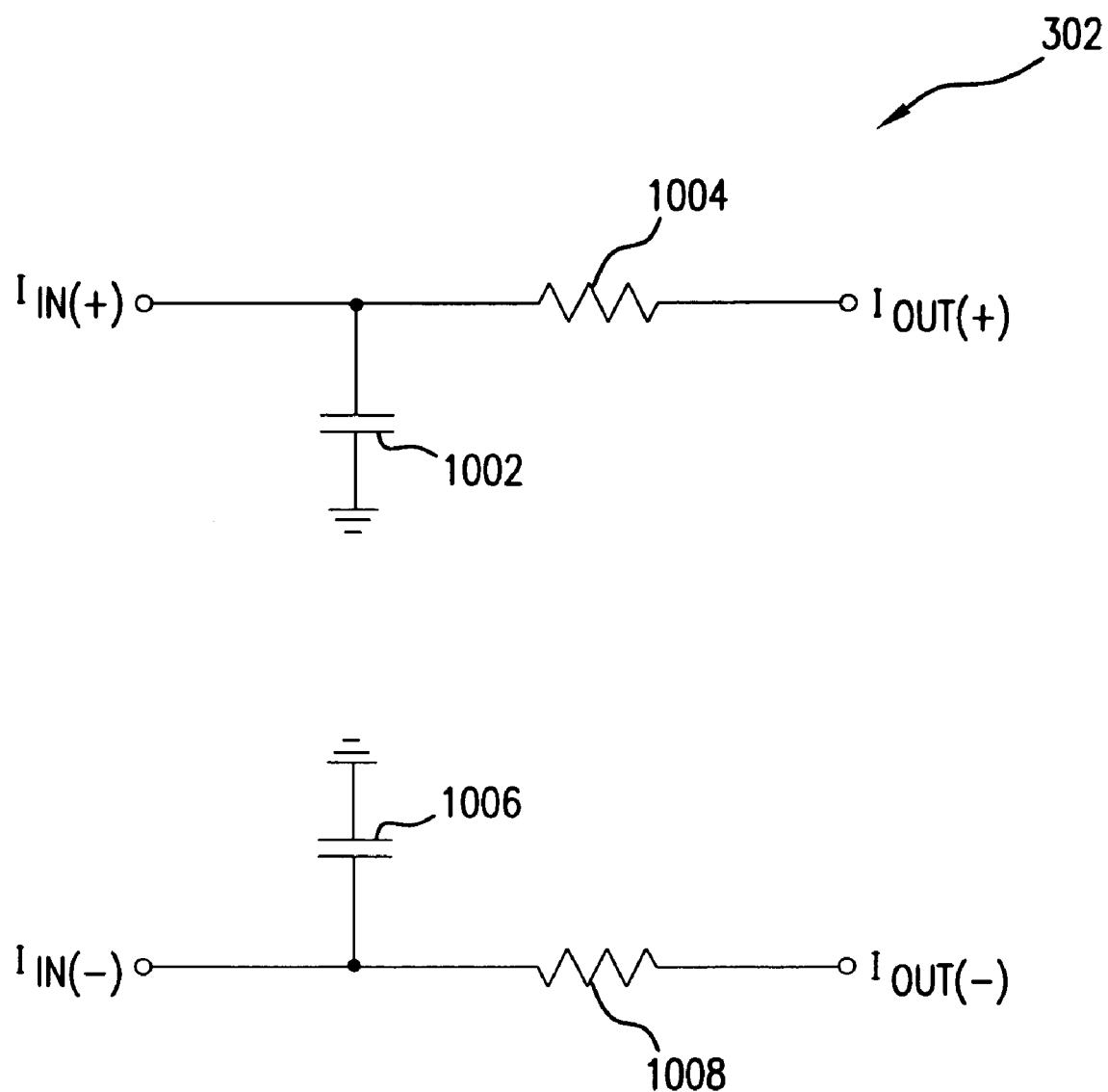
FIG. 10 illustrates a third example filter according to an embodiment of the invention.

FIG. 10 illustrates a third example filter 302 according to an embodiment of the invention. The example filter 302 shown in FIG. 10 is intended to be implemented as an integrated on-chip filter (i.e., it is intended to be integrated on the substrate with the DAC 202 and the upstream amplifier 206).

Filter 302 includes two capacitors 1002 and 1006 and two resistors 1004 and 1008. Notably, the example filter 302 does not have any inductors. In embodiments, wherein the sampling frequency of the DAC 202 is 400 MHz, filter 302 is a first-order low-pass filter.

Figure 11:
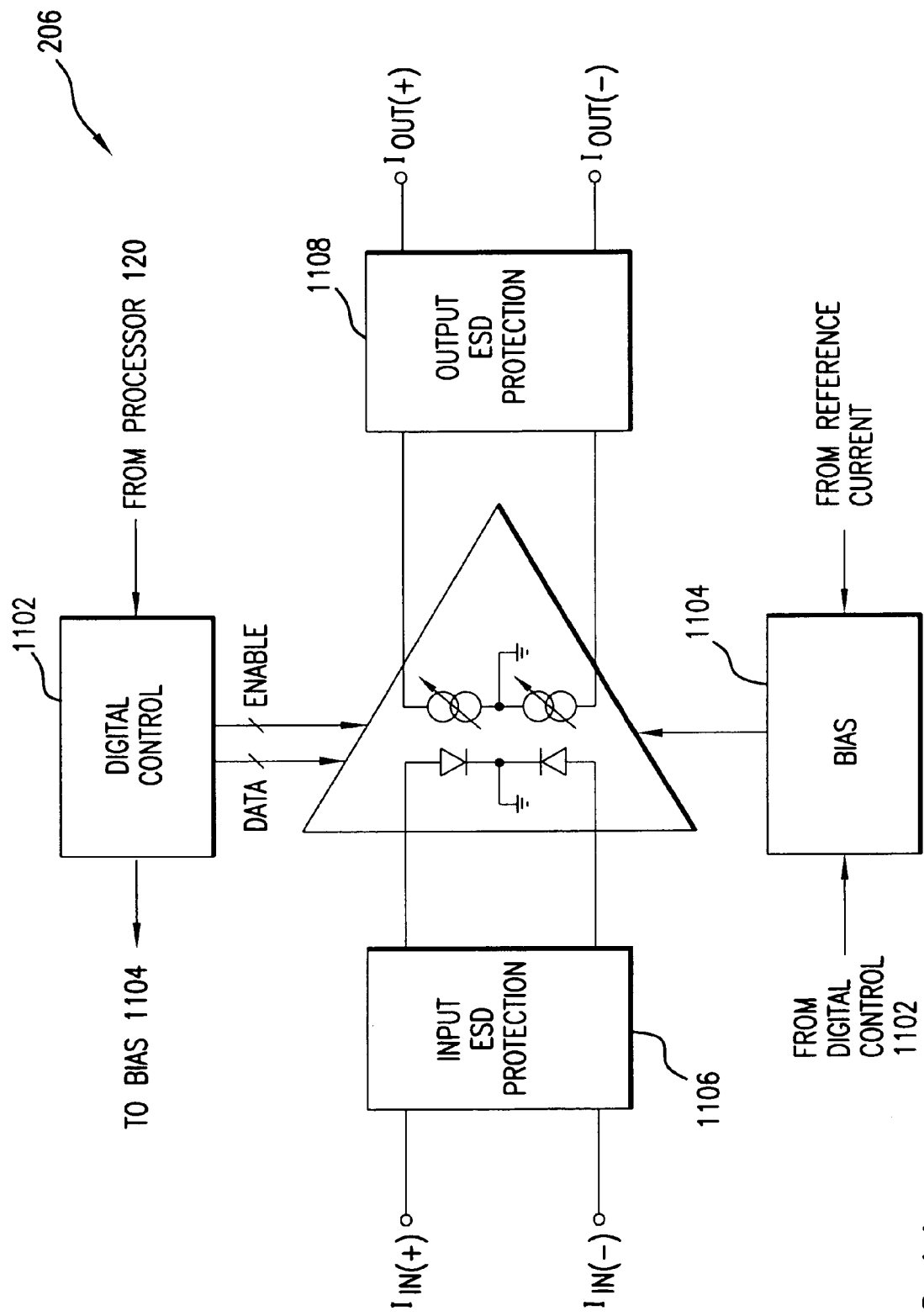
FIG. 11 illustrates a first block diagram of an example upstream amplifier according to an embodiment of the invention.

FIG. 11 illustrates a first block diagram of an example upstream amplifier 206 according to an embodiment of the invention. In embodiments of the invention, the upstream amplifier 206 includes a digital control network 1102, a bias network 1104, an optional input electrostatic discharge (ESD) protection network 1106, and an output ESD protection network 1108.

In embodiments of the invention, the digital control network 1102 receives inputs from the processor 120. These inputs include control bits to control the current gain of the upstream amplifier 206 and to control the operating mode of the upstream amplifier 206. As shown in FIG. 11, the digital control network sends both data bits and an enable bit to the upstream amplifier 206.

The upstream amplifier 206 has various modes of operation that are controlled by the processor 120 using digital control network 1102. In embodiments, the upstream amplifier 206 has a power-on mode of operation and a power-down mode of operation. In these embodiments, a software control bit can be used to switch between the power-on mode of operation and the power-down mode of operation. As suggested by its name, the power-down mode is used to conserve power when the upstream amplifier 206 is not needed.

In embodiments of the invention, the upstream amplifier 206 operates in a burst mode. This mode is controlled by the enable output of the digital control network 1102. In an embodiment, the output bursts of the upstream amplifier 206 are controlled using an internal transistor amplifier, a level shifter coupled to an input port of the internal transistor amplifier, and a switch. The switch is used to couple the level shifter to a voltage source (e.g., Vdd) or to a current sink to ground. The upstream amplifier 206 produces an output current proportional to an input current when the switch couples the level shifter to the current sink to ground (burst-on). The output current is turned off when the switch couples the level shifter to the voltage source (burst-off). These features of the upstream amplifier 206 are further described below with reference to FIG. 12.

The current-mode design of the upstream amplifier 206 reduces or eliminates any signal loss from the output current generated by the DAC 202 to the current-input of the upstream amplifier 206. In a current-mode design, the transformer output voltage swing is controlled, in part, by adjusting the upstream amplifier's current gain and, in part, by the upstream amplifier's load impedance. Furthermore, the upstream amplifier 206 has low-impedance internal nodes, which make for low internal voltage swings and very high achievable amplifier bandwidths.

The upstream amplifier 206 receives bias currents from the bias current network 1104. The bias currents generated by bias network 1104 are based on a reference current signal. In embodiments, the upstream amplifier 206 is a type class-A design that uses a variable internal quiescent current. The upstream amplifier 206 receives additional bias current from the DAC 202. The additional DAC 202 bias current scales along with the DAC 202 full-scale current swing. As a result, as the DAC 202 output scales down, and also as the upstream amplifier 206 gain is reduced, the upstream amplifier 206 total quiescent current reduces. This results in a reduction of power consumption. In other embodiments of the invention, the upstream amplifier 206 is a type class-AB design.

Figure 12:
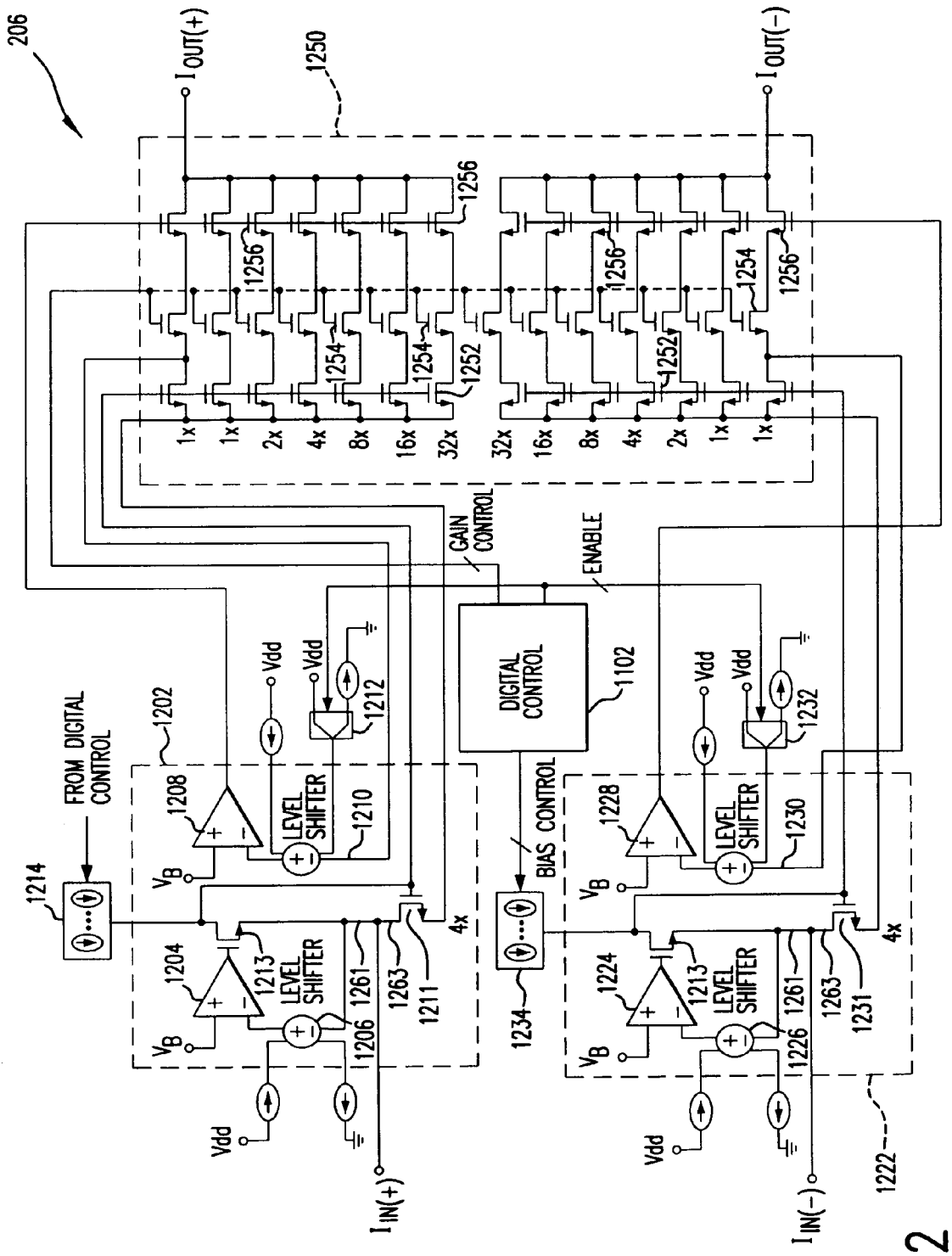
FIG. 12 illustrates a second block diagram of an example upstream amplifier according to an embodiment of the invention.

FIG. 12 illustrates a second, more detailed block diagram of an example upstream amplifier 206 according to an embodiment of the invention. As can be seen in FIG. 12, in an embodiment, upstream amplifier 206 includes an positive leg input network 1202, a negative leg input network 1222, and a controllable core 1250 in addition to the digital control network 1102. The positive leg input network 1202 includes an internal transistor amplifier 1204, a level shifter 1206, an internal transistor amplifier 1208, a level shifter 1210, a switch 1212, and two transistors 1211 and 1213. The negative leg input network 1222 includes an internal transistor amplifier 1224, a level shifter 1226, an internal transistor amplifier 1228, a level shifter 1230, a switch 1232, and two transistors 1231 and 1233. The controllable core 1250 includes a plurality of current-mirror output transistors 1252, a plurality of switches (transistors) 1254, and a plurality of cascode devices (transistors) 1256.

The transistors 1252 together with the two transistors 1211 and 1231 form a plurality of current mirrors. These current mirrors together with switches 1254 form a plurality of switched current mirrors. In an embodiment, current mirrors are formed using a plurality of input transistors 1211 and 1231 and two output transistors 1252. In another embodiment, current mirrors are formed using a plurality of input transistors 1211 and 1231 and a plurality of output transistors 1252.

Upstream amplifier 206 generally operates as follows. A scaled differential current signal is provided to the positive leg input port and the negative leg input port of upstream amplifier 206. A selected bias current 1261 is added to the scaled differential current signal to form an intermediate current signal 1263. This bias current is provided to improve the linearity of upstream amplifier 206. The added bias current 1261 comes from the plurality of switched current sources 1214 and 1234. The intermediate current signal 1263 is amplified using the plurality of switched current mirrors of the upstream amplifier 206. The number of switched current mirrors as well as which particular switched current mirrors are used to amplify the intermediate current signal are determined by a variable gain control signal. This variable gain control signal comes from the digital control network 1102 and is used to control the switches 1254. The output of upstream amplifier 206 is an amplified current signal.

As shown in FIG. 12, a first input current signal is coupled to the positive leg input network 1202 at transistor 1211. The transistor 1211 is diode-connected. Thus, the input impedance of network 1202 is low. The input impedance of the positive leg of upstream amplifier 206 is further reduced using the internal transistor amplifier 1204. The positive input port of internal transistor amplifier 1204 is coupled to a voltage source (Vb). The negative input port of internal transistor amplifier 1204 is coupled to a first port of the level shifter 1206. A second port of the level shifter 1206 is coupled to the transistor 1211. The output port of the internal transistor amplifier 1204 is coupled to the gate of the transistor 1213. Transistor 1213 is in the loop of the gate-drain feedback of transistor 1211. In an embodiment, a plurality of switched current sources 1214 provide a controllable bias current to the diode-connected transistor 1211. The switched current sources 1214 are controlled in an embodiment using a bias control signal from the digital control network 1102.

A second input current signal (typically 180 degrees out of phase with respect to the first input current signal) is coupled to the negative leg input network 1222 at transistor 1231. The transistor 1231 is also diode-connected. The input impedance of the negative leg of upstream amplifier 206 is reduced using the internal transistor amplifier 1224. The positive input port of internal transistor amplifier 1224 is coupled to a voltage source (Vb). The negative input port of internal transistor amplifier 1224 is coupled to a first port of the level shifter 1226. A second port of the level shifter 1226 is coupled to the transistor 1231. The output port of the internal transistor amplifier 1224 is coupled to the gate of the transistor 1233. Transistor 1233 is in the loop of the gate-drain feedback of transistor 1231. A plurality of switched current sources 1234 provide a controllable bias current to the diode-connected transistor 1231. The switched current sources 1234 are controlled in an embodiment using a bias control signal from the digital control network 1102.

The current gain of the upstream amplifier 206 is switchable or variable. This current gain of upstream amplifier 206 is switched or varied by using switches 1254 to couple the current-mirror output transistors 1252 to an output port of the upstream amplifier 206. Switching the gain of upstream amplifier 206 changes the output current or power level produced for a given input level. In one embodiment, the output signal level of the upstream amplifier 206 is varied, in part, by changing a bias current of the digital-to-analog converter 202. As can be seen in FIG. 12, any bias current supplied to the positive or negative input ports of the positive or negative legs of upstream amplifier 206 is supplied via transistor 1211 or transistor 1231 to the current-mirror output transistors 1252 and amplified. In another embodiment, the output signal level of the upstream amplifier 206 is varied, in part, by scaling a digital input value to the digital-to-analog converter 202. This technique adjusts the amount of input current that is amplified by upstream amplifier 206, and it is used in embodiments of the invention as a means for making fine amplitude adjustments.

The linearity of the positive leg output current signal is enhanced using the internal transistor amplifier 1208 and the cascode devices 1256 to increase the output impedance of the upstream amplifier 206. The positive input port of the internal transistor amplifier 1208 is coupled to a voltage source (Vb). The negative input port of the internal transistor amplifier 1208 is coupled to a first port of the level shifter 1210. A second port of the level shifter 1210 is coupled to a switch 1212. The output port the internal transistor amplifier 1208 is coupled to the gates of the cascode devices 1256.

The linearity of the negative leg output current signal is enhanced using the internal transistor amplifier 1228 and the cascode devices 1256. The negative input port of the internal transistor amplifier 1228 is coupled to a voltage source (Vb). The negative input port of the internal transistor amplifier 1228 is coupled to a first port of the level shifter 1230. A second port of the level shifter 1230 is coupled to a switch 1232. The output port of the internal transistor amplifier 1228 is coupled to the gates of the cascode devices 1256.

As described herein, in embodiments, the upstream amplifier operates in a burst mode. The output bursts of the positive leg are controlled using the internal transistor amplifier 1208, the level shifter 1210, and the switch 1212. The positive leg of upstream amplifier 206 produces an output current proportional to an input current when the switch 1212 couples the level shifter 1210 to the current sink to ground. The output current is turned off when the switch 1212 couples the level shifter 1210 to a voltage source (e.g., Vdd.)

The output bursts of the negative leg are controlled using the internal transistor amplifier 1228, the level shifter 1230, and the switch 1232. The negative leg of the upstream amplifier 206 produces an output current proportional to an input current when the switch 1232 couples the level shifter 1230 to the current sink to ground. The output current is turned off when the switch 1232 couples the level shifter 1230 to a voltage source (e.g., Vdd).

The method described above for disabling the outputs of the positive leg and the negative leg of upstream amplifier 206 gives an advantage in systems such as, for example, system 300 and system 340 in that the output noise of the systems in a burst-off state or a power-down mode is just the noise of the termination resistors (i.e., resistors 224 and 226 in system 300 and resistor 350 in system 340).

As shown in FIG. 12, in an embodiment, the upstream amplifier 206 includes fourteen switched (switchable) current mirrors. Seven of the switched current mirrors are associated with the positive leg of the upstream amplifier 206, and seven of the switched current mirrors are associated with the negative leg of the upstream amplifier 206. Each of these switched current mirrors produce varying amounts of current for a given current input. For example, in an embodiment, the current mirrors are related as follows: four of the current mirrors produce 0.25 times (1x÷4x) the amount of the input current; two of the current mirrors produce 0.5 times (2x÷4x) the amount of the input current; two of the current mirrors produce 1.0 times (4x÷4x) the amount of the input current; two of the current mirrors produce 2.0 times (8x÷4x) the amount of the input current; two of the current mirrors produce 4.0 times (16x÷4x) the amount of the input current; and two of the current mirrors produce 8.0 times (32x÷4x) the amount of the input current.

The switched current mirrors are turned-on and turned-off using gain control bits from digital control network 1102. In an embodiment, the switched current mirrors are turned-on and turned-off by a code such as, for example, a thermometer code that is applied to the switches 1254. As shown in FIG. 12, the switches 1254 can be coupled to the drains of the current-mirror output transistors 1252. The switches 1254 can also be coupled to the gates or to the sources of the current-mirror output transistors 1252, or to the drains of the cascode devices 1256, and used to switch the current mirrors on-and-off. Typically, at least one of the plurality of current mirrors (e.g., one of the 0.25x current mirrors in each leg of upstream amplifier 206) is always enabled (switched-on) during an output burst-on state of the upstream amplifier.

Figure 13:
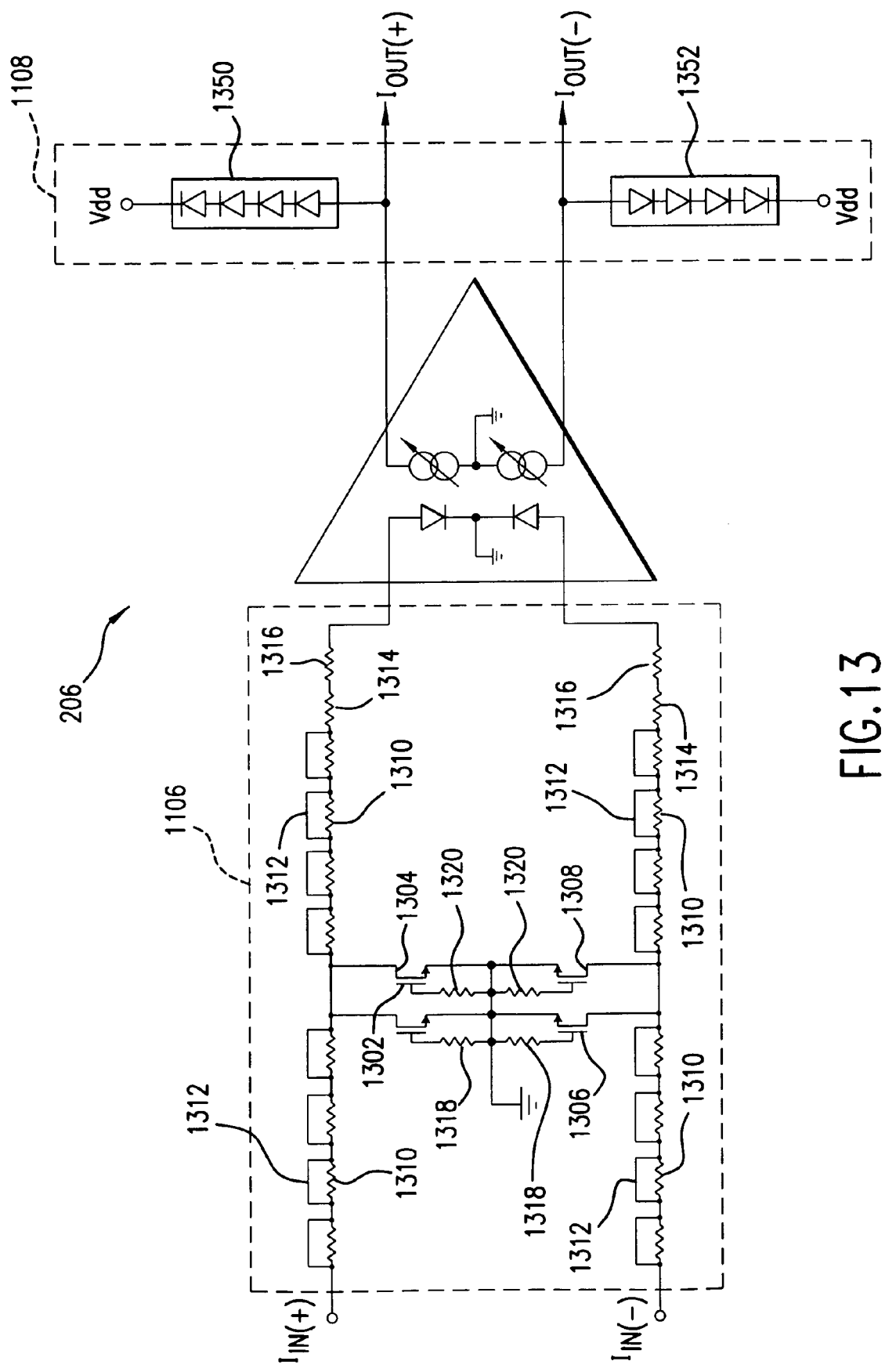
FIG. 13 illustrates a block diagram of an example electrostatic protection system for an upstream amplifier according to an embodiment of the invention.

FIG. 13 illustrates a block diagram of an example electrostatic protection system used with embodiments of upstream amplifier 206. As shown in FIG. 13, optional input ESD protection network 1106 includes resistors, transistors, and resistor bypass conductors. Output ESD protection network 1108 includes series connected diodes.

In an embodiment, optional input ESD protection network 1106 includes twenty-four resistors, four transistors, and sixteen resistor bypass conductors. Eight resistors 1310 and two series resistors 1314 and 1316 are included in each leg of optional input ESD protection network 1106. Each of the resistors 1310 is bypassed by a metal conductor 1312. The resistors 1314 and 1316 are not bypassed by a metal conductor 1312. The resistors 1314 and 1316 are sized in accordance with a minimum design resistance value. Additional series resistance is added after chip fabrication by disabling one or more of the metal bypass conductors 1312. In embodiments, transistors 1302 and 1306 are thin oxide devices. Transistors 1304 and 1308 are thick oxide devices. The gates of transistors 1302 and 1306 are coupled to ground using a resistor 1318. The gates of transistors 1304 and 1308 are coupled to ground using a resistor 1320. The sources of the four transistors 1302, 1304, 1306, and 1308 are also coupled to ground.

As described herein, inclusion of input ESD protection network 1106 with embodiments of upstream amplifier 206 is optional. This is because the purpose of input ESD protection network 1106 is to protect the upstream amplifier 206 from harmful electrostatic discharges at the input ports of the upstream amplifier 206. In embodiments of the invention where the input ports are not accessible off-chip, such as, for example, system embodiments where the low-pass filter is integrated on the same substrate as the upstream amplifier, no input ESD protection is required.

The input ESD protection network 1106 shown in FIG. 13 is used in embodiments of the invention to protect the upstream amplifier's diode-connected input transistors 1211 and 1231. The ESD protection network 1106 is added to embodiments of upstream amplifier 206 because, in embodiments, in order to optimize the performance of upstream amplifier 206, the input transistors 1211 and 1231 are not laid out with ESD layout features such as, for example, a longer gate length, a silicide blocking layer, elongated drains, and/or minimum width requirement.

As shown in FIG. 13, thin-gate-oxide ggNMOS (grounded-gate NMOS) devices 1302 and 1306 are placed in parallel with the input transistors 1211 and 1231. The thin gate devices 1302 and 1306 are chosen to have a shorter length than the input transistors 1211 and 1231, but they are laid out with full ESD features. The devices 1302 and 1306 go into snapback (i.e., ESD protection mode) before the input transistors 1211 and 1231 are exposed to any ESD discharge current.

The sizing of the thin-gate devices 1302 and 1306 can place them under excessive stress. Thus, to further protect the input transistors 1211 and 1231, thick-gate-oxide ggNMOS devices 1304 and 1308 are also placed in parallel with the input transistors 1211 and 1231. The thick-gate ggNMOS device sizes are chosen such that their snapback voltage match the snapback voltage of the input transistors as closely as possible. Each thick-gate ggNMOS 1304 and 1308 is laid out with full ESD layout features, and gives secondary clamping protection if the thin-gate device is (1) not sufficient to sink all the ESD current, or is (2) sized such that it is destructible and needs to be metal-masked out.

The series resistors 1314 and 1316 slow down any electric field buildup on the drain side of the input transistors 1211 and 1231. More series resistance offers better ESD protection, but too much series resistance presents headroom problems for the DAC 202.

In embodiments of the invention, the output ESD protection network 1108 includes two sets of series connected diodes 1350 and 1352. One set of series connected diodes 1350 is connected between the positive leg output port of upstream amplifier 206 and a voltage source (e.g., Vdd). The second set of series connected diodes 1352 is connected between the negative leg output port of upstream amplifier 206 and the voltage source. As shown in FIG. 13, in an embodiment, each set of series connected diodes 1350 and 1352 includes four diodes. More than one diode is used in each set to ensure that when the output voltage swings above the voltage of the voltage source during normal operation of the upstream amplifier 206, the series connected diodes do not adversely affect the linearity of the upstream amplifier 206. The number of series connected diodes required for a particular embodiment of the invention is dependent upon how high above the voltage of the voltage source the output voltage swings during normal operations and the turn-on voltage of the diodes used.

Figure 14:
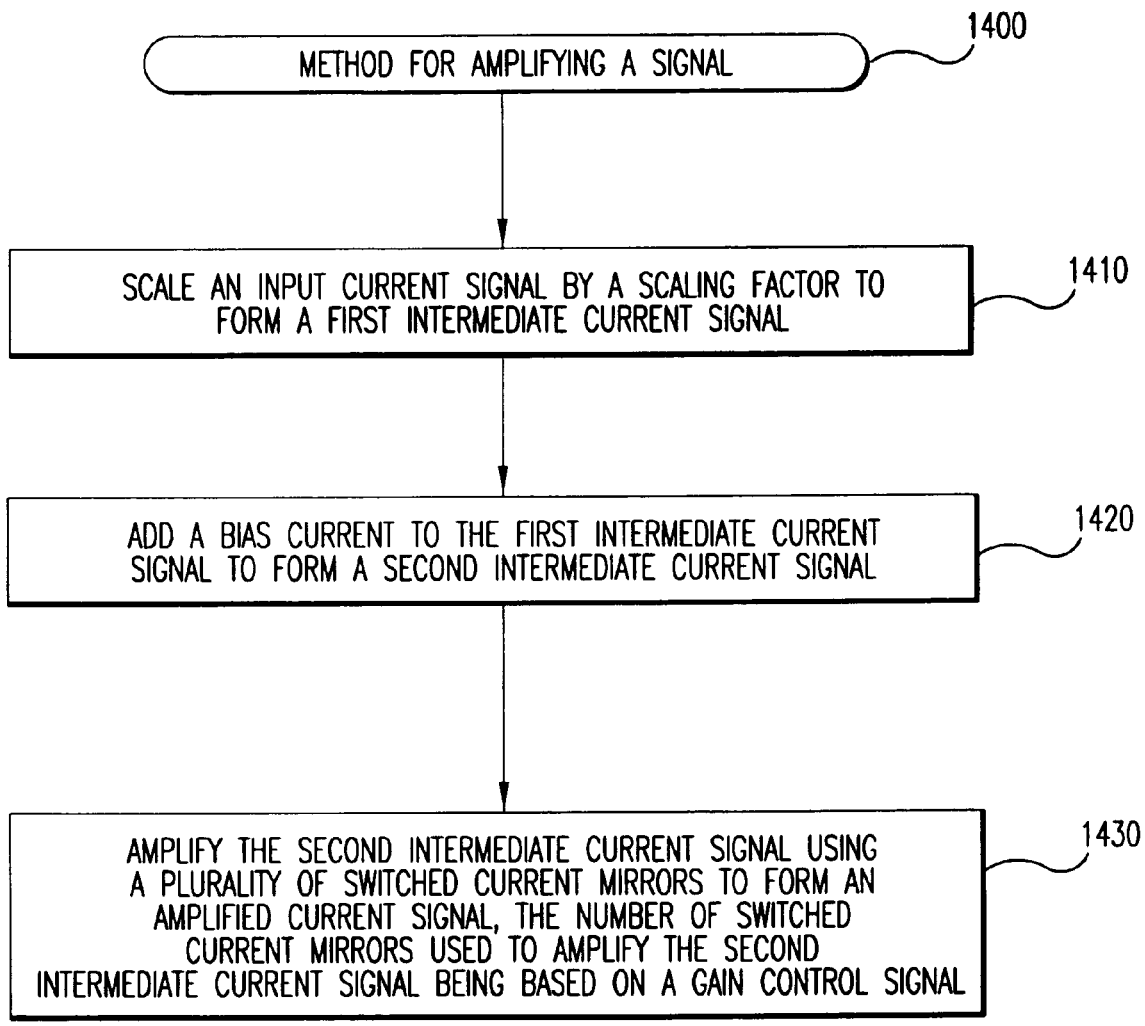
FIG. 14 illustrates a flowchart of the steps of a method for amplifying a signal according to an embodiment of the invention.

FIG. 14 illustrates a flowchart of the steps of a method 1400 for amplifying a signal according to an embodiment of the invention. Method 1400 comprises three steps 1410, 1420, and 1430. In step 1410, an input current signal is scaled by a scaling factor to form a first intermediate current signal. In step 1420, a bias current is added to the first intermediate current signal to form a second intermediate current signal. In step 1430, the second intermediate current signal is amplified using a plurality of switched current mirrors to form an amplified current signal. The number of switched current mirrors used to amplify the second intermediate current signal is based on a gain control signal.

In an embodiment of the invention, the gain control signal is varied to make course gain changes, and the scaling factor is varied to make fine gain changes.

In embodiments, the input current signal is formed from a voltage signal or a digital signal. In an embodiment, an amplified voltage signal is formed from the amplified current signal.

The various system embodiments of the invention described herein illustrate how to implement each of the steps of the method 1400. Method 1400 is not limited, however, to just the structural embodiments herein.

Figure 15:
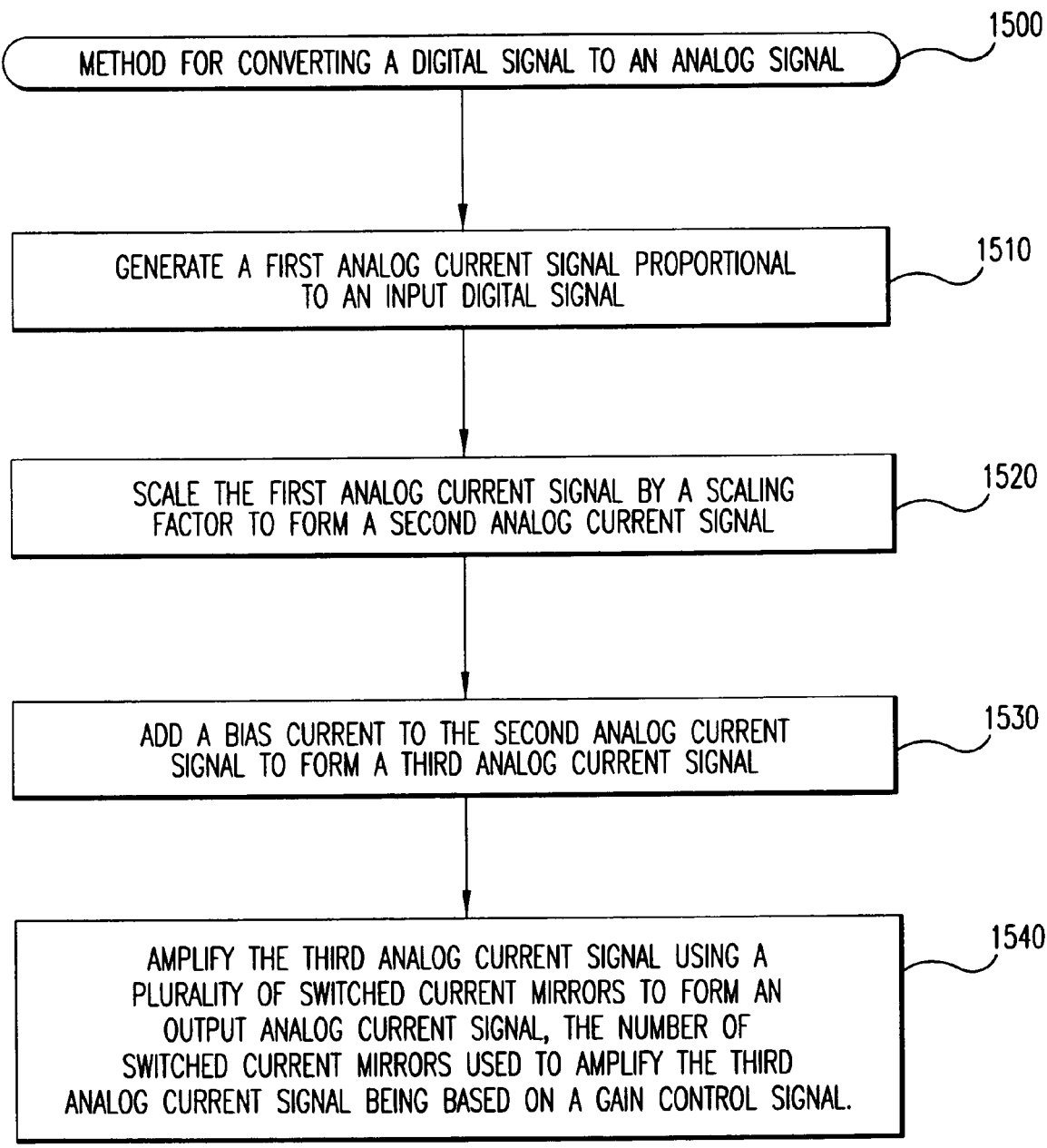
FIG. 15 illustrates a flowchart of the steps of a method for converting a digital signal to an analog signal according to an embodiment of the invention.

FIG. 15 illustrates a flowchart of the steps of a method 1500 for converting a digital signal to an analog signal. Method 1500 comprises four steps 1510, 1520, 1530, and 1540. In step 1510, a first analog current signal proportional to an input digital signal is generated. In step 1520, the first analog current signal is scaled by a scaling factor to form a second analog current signal. In step 1530, a bias current is added to the second analog current signal to form a third analog current signal. In step 1540, the third analog current signal is amplified using a plurality of switched current mirrors to form an output analog current signal. The number of switched current mirrors used to amplify the third analog current signal is based on a gain control signal.

In an embodiment of the invention, the gain control signal is varied to make course gain changes, and the scaling factor is varied to make fine gain changes. In an embodiment, an output analog voltage signal is formed from the output analog current signal.

As is the case with method 1400, the various system embodiments of the invention described herein also illustrate how to implement each of the steps of the method 1500. Method 1500 is not limited, however, to just the structural embodiments described herein.

Conclusions

Example embodiments of the of the present invention have been described herein. As noted elsewhere, these example embodiments have been described for illustrative purposes only, and are not limiting. Other embodiments are possible and are covered by the invention. Such other embodiments will be apparent to persons skilled in the relevant art(s) based on the teachings contained herein. Thus, the breadth and scope of the present invention should not be limited by any of the above-described exemplary embodiments, but should be defined only in accordance with the following claims and their equivalents.

What is claimed is:

1. An amplifier for amplifying a current signal, comprising:
    a substrate;
    a plurality of switched current mirrors disposed on the substrate;
    a plurality of switching transistors, disposed on the substrate, that enable or disable the plurality of switched current mirrors; and
    an input network, disposed on the substrate, that includes
        a transistor amplifier having a positive input port, a negative input port, and an output port,
        a transistor having a gate, a source, and a drain, wherein
            the gate of the transistor is coupled to the output port of the transistor amplifier,
            the source of the transistor is coupled to the negative input port of the transistor amplifier and a drain of an input transistor of the plurality of switched current mirrors, and
            the drain of the transistor is coupled to a gate of the input transistor of the plurality of switched current mirrors, and
        a plurality of switched current sources, configured for coupling to the drain of the transistor, wherein the plurality of switched current sources are used to adjust a bias current in the input network.

2. The amplifier of claim 1, wherein each of the plurality of switched current mirrors is enabled or disabled using a selected one of the plurality of switching transistors.

3. The amplifier of claim 2, wherein course gain changes are made by varying the number of switched current mirrors that are enabled.

4. The amplifier of claim 1, wherein the amplifier has a power-on mode of operation and a power-down mode of operation, and a software control bit is used to switch between the power-on mode of operation and the power-down mode of operation.

5. The amplifier of claim 1, wherein the amplifier operates in a burst mode.

6. The amplifier of claim 1, further comprising:
    an internal transistor amplifier;
    a level shifter coupled to an input port of the internal transistor amplifier; and
    a switch used to couple the level shifter to a voltage source or to a current sink to ground, wherein the amplifier produces an output current proportional to an input current when the switch couples the level shifter to the current sink to ground, and wherein the output current is turned off when the switch couples the level shifter to the voltage source.

7. The amplifier of claim 1, wherein at least one of the plurality of switched current mirrors is always enabled during an output burst-on state of the amplifier.

8. The amplifier of claim 1, wherein the plurality of switched current mirrors are controlled using a thermometer code.

9. The amplifier of claim 1, wherein the amplifier is a type class-A amplifier.

10. The amplifier of claim 1, wherein the amplifier is a type class-AB amplifier.

11. The amplifier of claim 1, wherein the amplifier power consumption scales with the amplifier output level.

12. The amplifier of claim 1, wherein fine gain changes are made by adjusting the bias current.

13. The amplifier of claim 1, wherein the amplifier is differential.

14. The amplifier of claim 1, wherein the amplifier includes electrostatic discharge protection on an input port of the amplifier.

15. The amplifier of claim 14, wherein the electrostatic discharge protection comprises a first grounded-gate NMOS device in parallel with a second grounded-gate NMOS device.

16. The amplifier of claim 15, wherein the first grounded-gate NMOS device is a thin-gate-oxide device and the second grounded-gate NMOS device is a thick-gate-oxide device.

17. The amplifier of claim 1, wherein the amplifier includes electrostatic discharge protection on an output port of the amplifier.

\* \* \* \* \*